US00RE49478E

(19) United States
(12) Reissued Patent
Kim et al.

(10) Patent Number: US RE49,478 E
(45) Date of Reissued Patent: Mar. 28, 2023

(54) IMAGE SENSOR INCLUDING MRAM (MAGNETIC RANDOM ACCESS MEMORY)

(71) Applicant: Samsung Electronics Co., Ltd., Suwon-si (KR)

(72) Inventors: Dae-shik Kim, Hwaseong-si (KR); Gwan-hyeob Koh, Seoul (KR)

(73) Assignee: SAMSUNG ELECTRONICS CO., LTD., Suwon-si (KR)

(21) Appl. No.: 17/121,968

(22) Filed: Dec. 15, 2020

Related U.S. Patent Documents

Reissue of:
(64) Patent No.: 10,157,951
Issued: Dec. 18, 2018
Appl. No.: 15/676,069
Filed: Aug. 14, 2017

(30) Foreign Application Priority Data

Jan. 13, 2017 (KR) ..... 10-2017-0006285

(51) Int. Cl.
*H04N 9/04* (2006.01)
*H01L 27/146* (2006.01)
(Continued)

(52) U.S. Cl.
CPC ..... *H01L 27/14634* (2013.01); *H01L 24/80* (2013.01); *H01L 27/1464* (2013.01); *H01L 27/1469* (2013.01); *H01L 27/14621* (2013.01); *H01L 27/14627* (2013.01); *H01L 27/14636* (2013.01); *H01L 27/14645* (2013.01); *H04N 5/78* (2013.01); *H04N 23/12* (2023.01); *H04N 23/689* (2023.01); *H04N 25/447* (2023.01);
(Continued)

(58) Field of Classification Search
CPC ..... H01L 27/14634; H01L 24/80; H01L 27/14621; H01L 27/14627; H01L 27/14636; H01L 27/1464; H01L 27/14645; H01L 27/1469; H01L 2224/80895; H01L 2924/1431; H01L 2924/1443; H01L 2924/146; H04N 5/2329; H04N 5/3532; H04N 5/3575; H04N 5/37455; H04N 5/37457; H04N 5/378; H04N 5/78; H04N 9/04511; H04N 9/07; H04N 5/907; H04N 2209/042
USPC ..... 348/281
See application file for complete search history.

(56) References Cited

U.S. PATENT DOCUMENTS 6,563,187 B1 * 5/2003 Park ..... H01L 27/14643 257/E21.654
8,455,267 B2 * 6/2013 Li ..... H01L 43/02 257/E21.665
(Continued)

FOREIGN PATENT DOCUMENTS

JP 2000-152051 5/2000
KR 10-2012-0108339 10/2012

*Primary Examiner* — Karin Reichle
(74) *Attorney, Agent, or Firm* — Muir Patent Law, PLLC

(57) ABSTRACT

A complementary metal-oxide semiconductor (CMOS) image sensor (CIS) with a simplified stacked structure and improved operation characteristics includes an upper chip, in which a plurality of pixels are arranged in a two-dimensional array structure, and a lower chip below the upper chip including a logic region having logic circuits and a memory region having embedded therein magnetic random access memory (MRAM) used as image buffer memory for storing image data processed by the logic region.

40 Claims, 14 Drawing Sheets

(51) Int. Cl.

| | |
|---|---|
| ***H01L 23/00*** | (2006.01) |
| ***H04N 5/78*** | (2006.01) |
| ***H04N 23/12*** | (2023.01) |
| ***H04N 23/68*** | (2023.01) |
| ***H04N 25/75*** | (2023.01) |
| ***H04N 25/447*** | (2023.01) |
| ***H04N 25/531*** | (2023.01) |
| ***H04N 25/616*** | (2023.01) |
| ***H04N 25/772*** | (2023.01) |
| ***H04N 25/778*** | (2023.01) |
| *H04N 5/907* | (2006.01) |

(52) U.S. Cl.

CPC ..... *H04N 25/531* (2023.01); *H04N 25/616* (2023.01); *H04N 25/75* (2023.01); *H04N 25/772* (2023.01); *H04N 25/778* (2023.01); *H01L 2224/80895* (2013.01); *H01L 2924/146* (2013.01); *H01L 2924/1431* (2013.01); *H01L 2924/1443* (2013.01); *H04N 5/907* (2013.01); *H04N 2209/042* (2013.01)

(56) References Cited

U.S. PATENT DOCUMENTS 8,530,880 B2 9/2013 Strukov et al.
8,918,580 B2 12/2014 Cheon
8,946,610 B2 * 2/2015 Iwabuchi ..... H01L 27/14643 257/443
8,982,260 B2 3/2015 Eshraghian et al.
10,224,279 B2 * 3/2019 Or-Bach ..... H01L 45/085
2004/0085463 A1 * 5/2004 Sharma ..... H01L 27/14634 348/231.99
2012/0032287 A1 * 2/2012 Li ..... B82Y 10/00 257/E27.103
2014/0136755 A1 * 5/2014 Hyde ..... G06F 15/7814 711/103
2015/0115134 A1 * 4/2015 Solhusvik ..... H04N 5/345 250/208.1
2015/0171314 A1 * 6/2015 Li ..... H01L 43/02 257/421
2015/0249096 A1 * 9/2015 Lupino ..... H01L 27/11898 257/203
2015/0281613 A1 * 10/2015 Vogelsang ..... H04N 5/379 348/300
2015/0312438 A1 10/2015 Tatsuzawa et al.
2016/0063668 A1 3/2016 Kim
2016/0117020 A1 * 4/2016 Takemura ..... G06F 3/04166 345/174
2016/0126267 A1 5/2016 Barr et al.
2016/0163254 A1 * 6/2016 Lee ..... G11C 5/02 345/545
2016/0248990 A1 8/2016 Kim et al.
2017/0084820 A1 * 3/2017 Tan ..... H01L 43/12
2017/0124695 A1 * 5/2017 Seok ..... G06T 7/0004
2017/0154873 A1 * 6/2017 Kim ..... H01L 24/73
2017/0345475 A1 * 11/2017 Lee ..... G11C 13/0002
2018/0240797 A1 * 8/2018 Yokoyama ..... H01L 25/074
2020/0267341 A1 * 8/2020 Baba ..... H04N 5/369

* cited by examiner

NEW
FIG. 8C
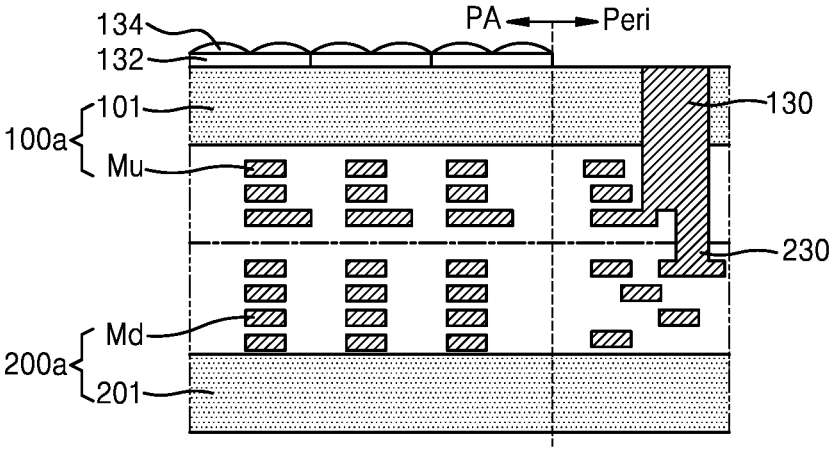

IMAGE SENSOR INCLUDING MRAM (MAGNETIC RANDOM ACCESS MEMORY)

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATION

This application claims the benefit of Korean Patent Application No. 10-2017-0006285, filed on Jan. 13, 2017, in the Korean Intellectual Property Office, the disclosure of which is incorporated herein in its entirety by reference.

BACKGROUND

The inventive concept relates to an image sensor, such as a complementary metal-oxide semiconductor (CMOS) image sensor, having a stacked structure in which two semiconductor chips are bonded to each other.

Generally, a CMOS image sensor (CIS) may include a pixel area and a logic area. In the pixel area, a plurality of pixels are arranged in a two-dimensional array structure, wherein each pixel includes a photodiode and several pixel transistors. The pixel transistors may include, for example, a transfer transistor, a reset transistor, a source follower transistor, and a selecting transistor. Logic circuits for processing pixel signals from the pixel area may be arranged in the logic area. Recently, a CIS has been developed where a pixel area is formed on one chip and a logic area is formed on another chip and the two chips are stacked together. A CIS having such a stacked structure may provide images with high image quality due to, for example, being able to increase of the number of pixels in the pixel area without decreasing their size and/or optimization of performance of logic circuits in the logic area.

SUMMARY

The inventive concept provides an image sensor, such as a complementary metal-oxide semiconductor (CMOS) image sensor (CIS), with a simplified stacked structure and improved operation characteristics.

According to an aspect of the inventive concept, there is provided a complementary metal-oxide semiconductor (CMOS) image sensor (CIS) including an upper chip, in which a plurality of pixels are arranged in a two-dimensional array structure; and a lower chip, which is below the upper chip and includes a logic region having arranged therein logic circuits and a memory region having embedded therein a magnetic random access memory (MRAM), wherein the MRAM is configured to operate as image buffer memory for storing image data processed by the logic region.

According to another aspect of the inventive concept, there is provided a complementary metal-oxide semiconductor (CMOS) image sensor (CIS) including an upper chip, in which a plurality of pixels are arranged in a two-dimensional array structure, color filters and micro-lenses are arranged above the pixels, and first wire layers are arranged below the pixels, wherein each of the plurality of pixels includes a photodiode and pixel transistors; and a lower chip, which is below the upper chip and includes a logic region having arranged therein logic circuits and second wire layers and a memory region having disposed therein a magnetic random access memory (MRAM) adjacent to the logic region, wherein the first wire layers are electrically connected to the second wire layers, and the MRAM is configured to operate as image buffer memory for storing image data processed by the logic region.

BRIEF DESCRIPTION OF THE DRAWINGS

Example embodiments of the inventive concept will be more clearly understood from the following detailed description taken in conjunction with the accompanying drawings in which:

FIG. 8C is a cross-sectional view of a structure in which an upper chip and a lower chip are bonded to each other, including additional details*;

DETAILED DESCRIPTION OF THE EMBODIMENTS

Figure 1:
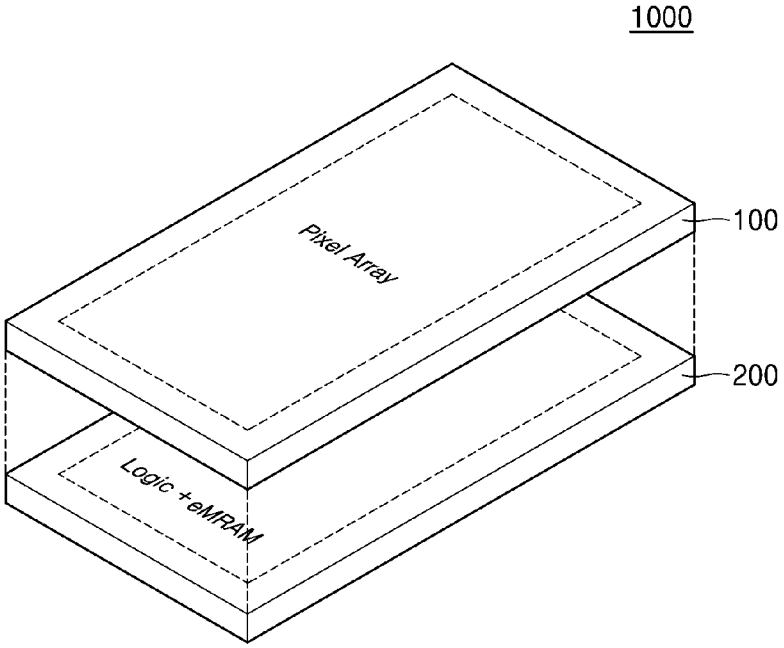
FIG. 1 is an exploded perspective view of a complementary metal-oxide semiconductor (CMOS) image sensor (CIS) according to an example embodiment, in which an upper chip in which pixels are arranged and a lower chip in which logic circuits are arranged are separately shown.

FIG. 1 is an exploded perspective view of a complementary metal-oxide semiconductor (CMOS) image sensor (CIS) according to an example embodiment. The CIS of FIG. 1 comprises an upper chip 100 including pixels and a lower chip 200 including logic circuits. Chips 100 and 200 are shown spaced apart for purposes of illustration.

In the CIS 1000 according to the present embodiment, the upper chip 100 comprises a plurality of pixels arranged in a two-dimensional array structure (to be described below in more detail with reference to FIGS. 2 through 3B). The lower chip 200 comprises a logic area (210 in FIG. 4) and a memory area (220 in FIG. 4). The lower chip is electrically connected to the upper chip 100 so that pixel signals from the upper chip 100 may be transferred to logic circuits of the logic area 210 of the lower chip 200. The stacked structure of the upper chip 100 and the lower chip 200 will be described below in more detail with reference to FIGS. 8A through 9B.

The logic circuits may be arranged in the logic area 210 of the lower chip 200. The logic circuits may constitute various circuits for processing pixel signals received from pixels. For example, the logic circuits may constitute an analog signal processing circuit, an analog-to-digital converter (ADC) circuit, an image signal processing circuit, and a control circuit. However, the circuits implemented by the logic circuits are not limited thereto.

Magnetic random access memory (MRAM) may be disposed in the memory area 220. Specifically, a plurality of MRAM cells may be arranged in a two-dimensional array structure in the memory area 220. Each of the MRAM cells may include a cell transistor and magnetic tunnel junction (MTJ) structure as a unit cell. The two-dimensional array structure, the unit cell, and the MTJ structure of the MRAM cells will be described below in more detail with reference to FIGS. 6A through 7D.

In the CIS 1000 according to the present embodiment, the MRAM of the memory area 220 may be disposed and embedded together with the logic circuits of the logic area 210. For example, logic circuits of the logic area 210 and the MRAM of the memory area 220 may comprise an integrated circuit and be formed by a CMOS semiconductor manufacturing process. The embedded form of the MRAM will be described below in more detail with reference to FIG. 5. In FIG. 1, the lower chip 200 is described as Logic+eMRAM, where 'e' of the eMRAM denotes embedded (i.e., indicating that the MRAM is embedded MRAM formed on and integral with the logic circuits of logic area 210 on the same semiconductor chip).

In the CIS 1000 according to the present embodiment, the MRAM may be arranged in an embedded form in the memory area 220 of the lower chip 200, and the MRAM may comprise an image buffer memory for storing frame images. Therefore, the CIS 1000 may perform signal processing after temporarily storing frame images in the MRAM, thereby significantly improving the operation characteristics of the CIS 1000. Furthermore, in the CIS 1000 according to the present embodiment, as the MRAM is disposed in an embedded form together with the logic circuits of the logic area 210, the overall manufacturing process may be simplified and a size of an entire product may be reduced (or the same size may achieve better results). Therefore, the CIS 1000 according to the present embodiment may be manufactured with increased yield and reduced cost.

In a CIS, data from pixels, that may be provided as pixel signals, may be read out by driving an electronic shutter according to a driving scheme referred to as a rolling shutter scheme. According to the rolling shutter scheme, pixel data from all pixels are not simultaneously read out, and pixel data are read out row-by-row. In addition, exposure times of each row overlap so that, for a frame of image data (corresponding to pixel data for the entire pixel array) start times and end times of exposure of each row differ. As a result, timings for exposure and reading data of respective rows differ from one another, and when an object moves while pixel data is being generated (via exposure of the pixels) and sequentially read row-by-row, a rolling shutter effect causing a skewed image distorting an object image within an image frame may occur. A global shutter scheme for reducing this rolling shutter effect has been developed by adding a circuitry that stores data for each pixel. However, since this scheme increases the size of a CIS, it may not be desirable for certain applications, such as a CIS for a smart phone.

In order to reduce the rolling shutter effect in the rolling shutter scheme, a scheme for reading the data of pixels of each row as quickly as possible to reduce a time difference has been developed. However, in the case of this scheme, since a large amount of pixel data should be read out within a short time period (to thereby reduce the deviation between the start and end times of the row exposures of an image frame), transmission of the pixel data must be quickly, which may require added complexity to the design of an I/O unit of the CIS and an application processor (AP) receiving this pixel data, and thus using this scheme has difficulties in directly processing the pixel data.

The CIS 1000 according to the present embodiment may address the above problems by using the MRAM as image buffer memory. For example, the above blurring problem may be resolved by temporarily storing pixel data as frame images in the MRAM before the pixel data is processed by the AP. As will be understood, a frame image comprises the set of pixel data for pixels extending across the two-dimensional array for a sensed image for a frame period. The frame image may comprise pixel data of all of the pixels, of a subset thereof (e.g., when performing image stabilization or otherwise reducing the amount of pixels corresponding to an image frame). The exposure start times of the next frame image may be initiated before the previous frame image has been read out of the CIS 1000. Thus, the time to read out the image frame data to a source external to the CIS 1000 may be performed more slowly (e.g., corresponding to the length of exposure time of an image frame) without contributing to a rolling shutter effect. Furthermore, in the CIS 1000 according to the present embodiment, since the MRAM is embedded in the lower chip 200 having arranged logic circuits therein, an additional chip is unnecessary, and thus, the total size of the CIS 1000 may not increase. Furthermore, since the MRAM is formed in the lower chip 200 together with logic circuits via a CMOS process, the CIS 1000 according to the present embodiment may be manufactured via a simplified manufacturing process with high yield and reduced cost.

Figure 2:
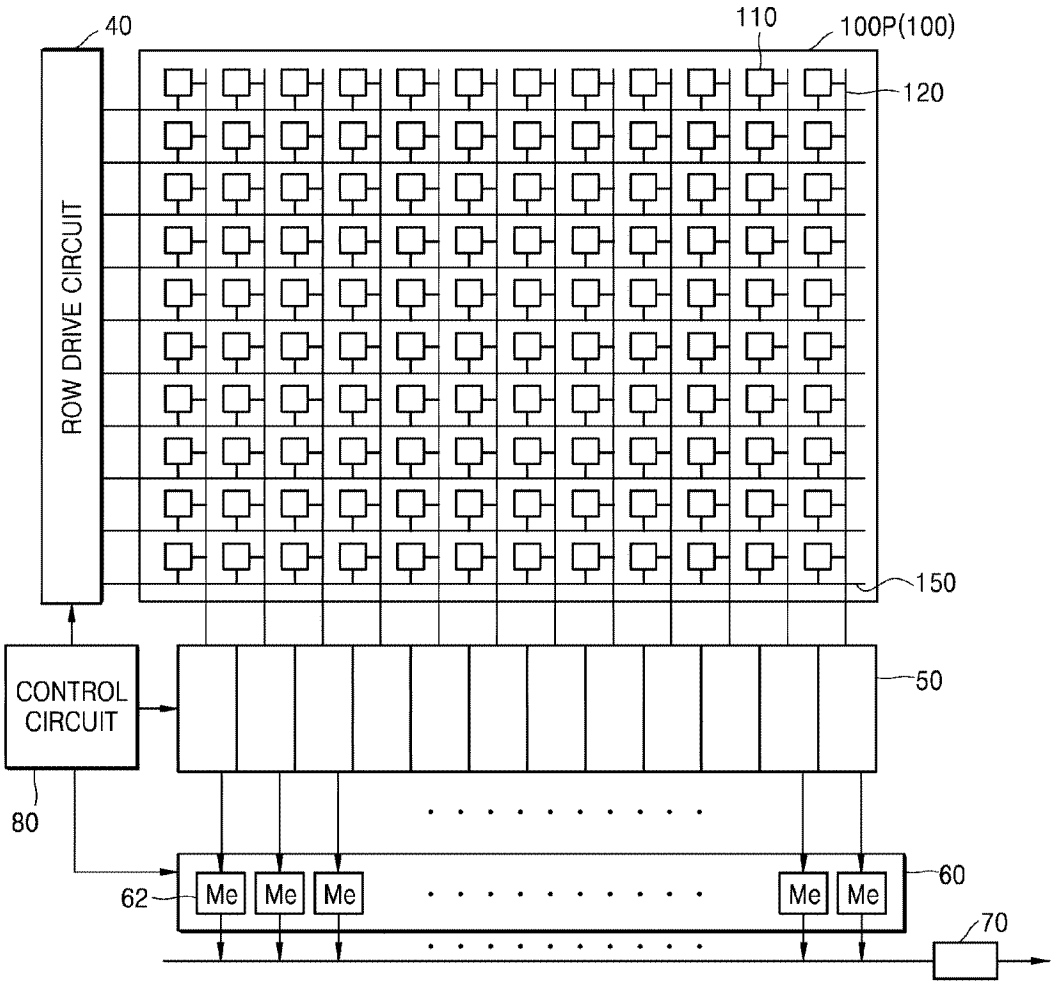
FIG. 2 is a schematic diagram showing a two-dimensional array structure of pixels arranged in the upper chip in the CIS of FIG. 1 and peripheral circuits according to an example embodiment.

FIG. 2 is a schematic diagram showing a two-dimensional array structure of pixels arranged in the upper chip 100 in the CIS of FIG. 1 and peripheral circuits, according to an example embodiment.

Referring to FIG. 2, the CIS 1000 according to the present embodiment may include a pixel [unit] *array* 100P and peripheral circuits. The pixel [unit] *array* 100P may be disposed in the upper chip 100 and a plurality of pixels 110 may be regularly arranged in a two-dimensional array structure. Each of the pixels 110 may be part of a unit pixel or pixel group and include a photodiode and pixel transistors. The structure of an exemplary unit pixel will be described below in more detail with reference to FIGS. 3A and 3B.

The peripheral circuits are disposed in the lower chip 200 and may include a row drive circuit 40, a column signal processing circuit 50, an image buffer memory 60, an output circuit 70, and a control circuit 80. The circuits of the peripheral circuits may include logic circuits (e.g., circuits formed from NAND gates, NOR gates, inverters, etc., formed from interconnected transistors of the lower chip 200). It should be appreciated that some of these or other peripheral circuits may be formed in the upper chip 100 instead of the lower chip 200.

The control circuit 80 may control overall operations of other peripheral circuits. For example, the control circuit 80 may generate one or more clock signals and/or control signals for operating the row drive circuit 40 and the column signal processing circuit 50 based on a master clock signal, and input a vertical synchronization signal, a horizontal synchronization signal, and a master clock signal and an input the clock signal or other control signals to the row drive circuit 40 and the column signal processing circuit 50.

The row drive circuit 40 may include, for example, a shift register, and may drive pixels row-by-row by selecting a pixel driving wire of a row of pixels and supplying a pulse for driving the row of pixels connected to the selected pixel driving wire or row line 150. For example, the row drive circuit 40 may sequentially activate the rows of pixels by sequentially and selectively providing scan pulses to the pixels 110 of the pixel [unit] *array* 100P row-by-row in the column-wise direction. Furthermore, upon such activation of a row of pixels by the row drive circuit 40, pixel signals corresponding to charges generated by respective photodiodes of the pixels 110 (e.g., during an exposure period corresponding to an image frame) may be provided to the column signal processing circuits 50 through column signal lines 120.

The column signal processing circuits 50 are arranged according to respective columns of the pixels 110 and may perform signal processing, such as noise removal, with respect to signals output from the pixels 110 row-by-row for each pixel column. For example, the column signal processing circuit 50 may perform signal processing, such as correlated-double sampling (CDS), signal amplification, and A/D (analog to digital) conversion, for removing noise inherent to the pixels 110. The column signal processing circuit 50 may comprise a plurality of sub-circuits (as shown in FIG. 2), each connected to a corresponding column signal line 120 to perform such processing in parallel for signals output from a row of pixels 110.

The image buffer memory 60 may include a plurality of memories 62. Each of the memories 62 may be MRAM. The image buffer memory 60 may temporarily store pixel signals, i.e., image data, processed by the column signal processing circuit 50. Also, the image buffer memory 60 may store pixel signals for each frame image.

The output circuit 70 may perform signal processing on signals sequentially transferred from the image buffer memory 60 and output signal-processed signals. For example, the output circuit 70 may perform only amplification or may perform various signal processing operations other than amplification. For example, the output circuit 70 may perform various digital signal processing operations including bad pixel correction (BPC), lens shading correction (LSC), black level adjustment, thermal inconsistency correction, etc. However, the signal processing functions of the output circuit 70 may also be performed by a processor external to the CIS 100, such as an application processor AP.

In the CIS 1000 according to the present embodiment, MRAM may be employed as the image buffer memory 60. Therefore, the CIS 1000 according to the present embodiment may have improved operating characteristics with a smaller size, and the manufacturing process thereof may be simplified and carried out with high yield and reduced cost. For reference, a case wherein MRAM is used as the image buffer memory 60 as in the CIS 1000 according to the present embodiment may be compared with a case wherein dynamic random access memory (DRAM) or static random access memory (SRAM) is used as the image buffer memory 60. In the case of employing DRAM, a separate chip may be necessary because it is difficult to embed the DRAM in a lower chip having disposed therein logic circuits due to its structural characteristics. Furthermore, in the case of employing SRAM, since the size of SRAM is large, the total size of a CIS may increase.

More specifically, the SRAM has a large size as compared to MRAM, because each unit cell of the SRAM has a six-transistor (6Tr) structure (or more transistors). Furthermore, although the SRAM consumes a smaller current than the DRAM in a standby mode, the current consumption of the SRAM still deteriorates energy efficiency. On the contrary, in the case of the MRAM, since a cell has a 1Tr or 2Tr structure, a size of the MRAM may be significantly reduced since the size of each cell is reduced. For example, MRAM may be implemented to have a cell size from $6F^2$ to $8F^2$ and thus may be implemented to have a size of from about ¼ to about ⅓ of that of the SRAM. Here, F denotes a minimum lithographic feature size. Furthermore, in case of using the MRAM, since little standby power is consumed, the energy efficiency may be very high.

Figure 3A:
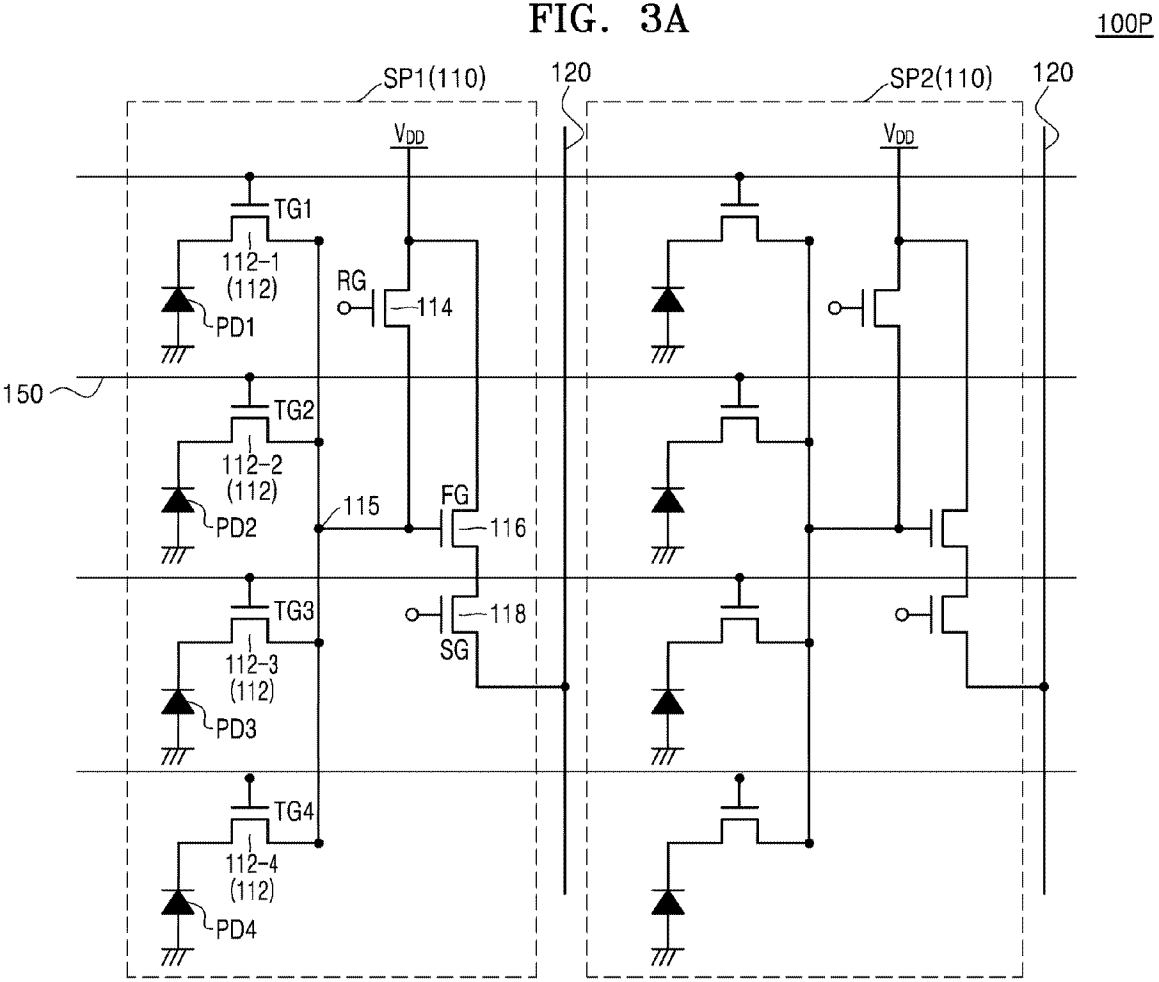
FIGS. 3A and 3B are a circuit diagram and a corresponding schematic plan view of a unit pixel constituting each of the pixels of FIG. 2 according to an example embodiment.
Figure 3B:
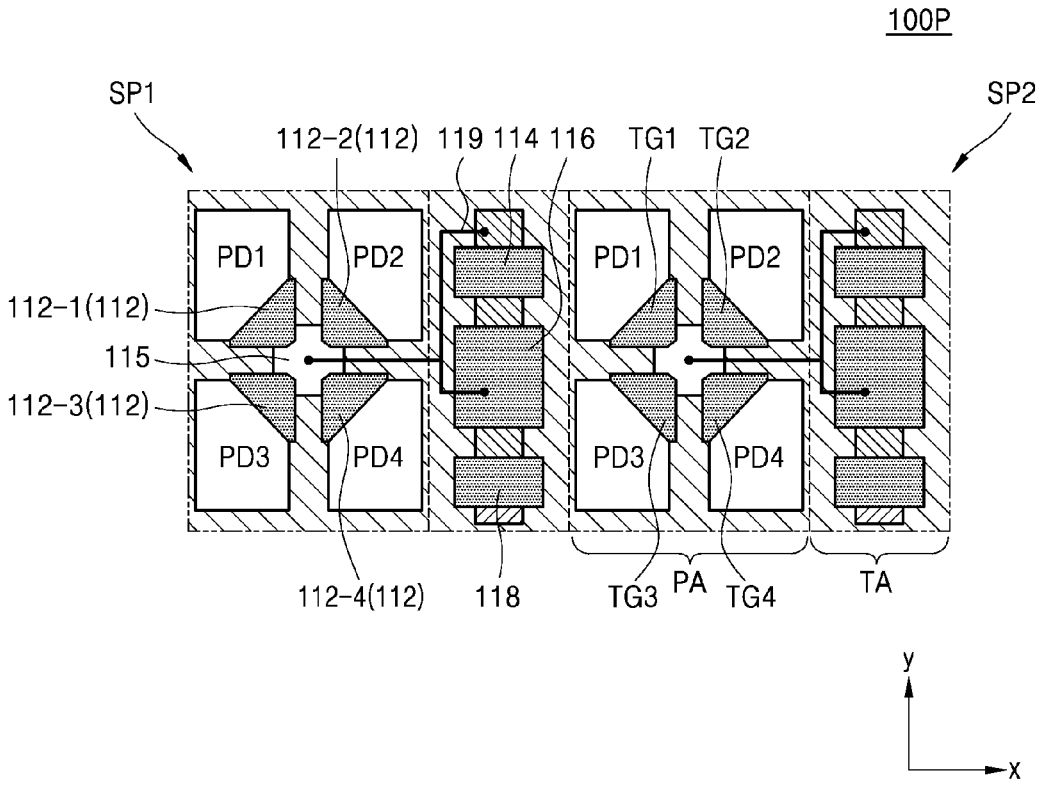

FIGS. 3A and 3B respectively show a circuit diagram and a corresponding schematic plan view of a unit pixel constituting each of the pixels of FIG. 2, according to example embodiments.

Referring to FIGS. 3A and 3B, a plurality of pixel groups SP are arranged to share certain circuitry ("SP" referring to sharing of certain circuitry and structure among the pixel group). In this implementation, each pixel group SP comprises four pixels. Theses pixel groups SP may be arranged in a two-dimensional array structure in the pixel [unit] *array* 100P of the upper chip 100 in FIG. 2 in the CIS 1000 according to the present embodiment. In FIGS. 3A and 3B, only two pixel groups SP1 and SP2 (adjacent to each other in a first direction (an x-axis direction)) are shown in FIGS. 3A and 3B. However, as shown in FIG. 2, in the pixel [unit] *array* 100P, the plurality of pixel groups SP are arranged in a two-dimensional array structure along both the first direction (the x-axis direction) and a second direction (a y-axis direction).

In the CIS 1000 according to the present embodiment, four pixels are arranged in a pixel area PA, and transistors 114, 116, and 118 are arranged in a transistor area TA. Four pixels may constitute a single pixel group SP and share use of transistors 114, 116 and 118. For example, the first pixel group SP1 may have a structure in which four photodiodes PD1 through PD4 surround and share one floating diffusion (FD) region 115. Furthermore, the second pixel group SP2 may also have a structure in which four photodiodes PD1 through PD4 share one floating diffusion FD area 115. Each floating diffusion FD area may be separate from other floating diffusion FD areas. In the CIS 1000 according to the present embodiment, one pixel may be formed using only one photodiode. Therefore, unless otherwise stated, a photodiode will be understood to correspond to a pixel will be described below accordingly.

In the pixel group SP, the one FD area 115 may be shared by the four photodiodes PD1 through PD4 via the transfer transistors 112 respectively corresponding to the photodiodes PD1 through PD4, as shown in the circuit diagram of FIG. 3A. Specifically, a first transfer transistor 112-1 corresponding to the first photodiode PD1, a second transfer transistor 112-2 corresponding to the second photodiode PD2, a third transfer transistor 112-3 corresponding to the third photodiode PD3, and a fourth transfer transistor 112-4 corresponding to the fourth photodiode PD4 may share the FD area 115 as a common drain region.

In addition to the four photodiodes PD1 through PD4 sharing the same FD area 115, the four photodiodes PD1 through PD4 of a pixel group SP may share the transistors 114, 116, and 118. In this example, the four photodiodes PD1 through PD4 constituting the pixel group SP may share a reset transistor 114, a source follower transistor 116, and a selecting transistor 118. The reset transistor 114, the source follower transistor 116 and the selecting transistor 118 may be arranged along the second direction (the y-axis direction) in the transistor area TA. The reset transistor 114 may be activated to reset the floating charge accumulated by the photodiodes PD1 through PD4 connecting the photodiodes PD1 through PD4 to the power supply Vdd removing all integrated charge from the previous exposure period. Source follower transistor 116 provides an analog pixel signal to column signal line 120 corresponding to the charge accumulated by a selected photodiode PD1 through PD4, (as selected by row line 150). Select transistor 118 operates to connect the analog pixel signal provided by the source follower transistor 116 to the corresponding column signal line 120. The transfer transistors 112, the reset transistor 114, the source follower transistor 116 and the selecting transistor 118 of each pixel group SP may be considered part of the pixel [unit] *array* and integrated within the upper chip 100. In this example, each pixel group SP may have transfer transistors 112, the reset transistor 114, the source follower transistor 116 and the selecting transistor 118 that are not shared with other pixel groups 110.

Referring to the circuit diagram of FIG. 3A for a connection relationship between the transistors 112, 114, 116, and 118, the four photodiodes PD1 through PD4 may be connected to source regions of the corresponding four transfer transistors 112. Drain regions of the transfer transistors 112 may be connected to a source region of the reset transistor 114. The common drain region of the transfer transistors 112 may correspond to the FD area 115. The FD region 115 may be connected to a gate electrode of the source follower transistor 116 via a wire 119, in other words, a source follower gate electrode FG and a source region of the reset transistor 114. The reset transistor 114 and the source follower transistor 116 may share same drain region that may be connected to a power supply voltage $V_{DD}$. A source region of the source follower transistor 116 may be shared with the selecting transistor 118 and a drain region of the selecting transistor 118 may be shared with the source follower transistor 116 and a source region of the selecting transistor 118 may be connected to the column signal line 120. The voltage of the source region of the selecting transistor 118 may be output to the column signal line 120 as an output signal.

In the CIS 1000 according to the present embodiment, a unit pixel constituting the pixels 110 of the pixel [unit] *array* 100P of the upper chip 100 includes four shared pixels and the corresponding transistors 114, 116, and 118 in the transistor area TA. Furthermore, a unit pixel may include the transfer transistors 112 in correspondence to a number of shared photodiodes. The transistors 114, 116 and 118 of the transistor area TA and the transfer transistors 112 are referred to as pixel transistors.

In the CIS 1000 according to the present embodiment, the structure of a unit pixel is formed by a pixel group SP of the pixel [unit] *array* 100P of the upper chip 100, but may vary from this particular implementation. For example, in the CIS 1000 according to the present embodiment, the unit pixel constituting the pixel group SP of the pixel [unit] *array* 100P of the upper chip 100 may have various structures, e.g., a structure including one photodiode (of one photodiode) and pixel transistors corresponding thereto, a 2-shared pixel structure including two photodiodes (of two pixels) and pixel transistors corresponding thereto, an 8-shared pixel structure including 8 photodiodes (of 8 pixels) and pixel transistors corresponding thereto, etc.

Figure 4:
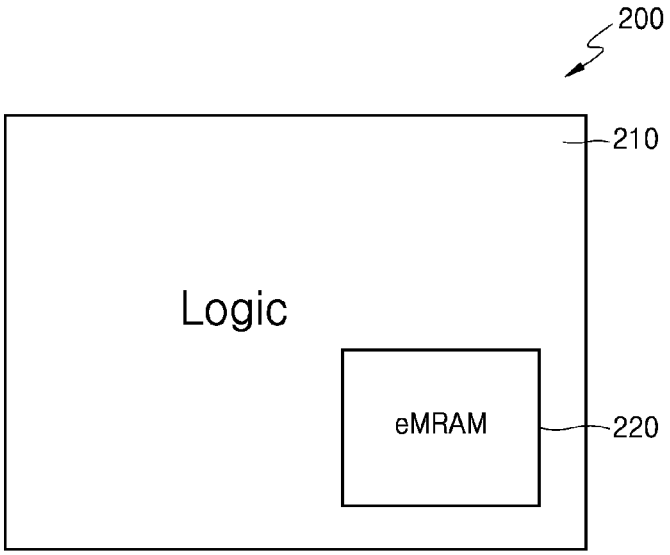
FIG. 4 is a schematic diagram showing a logic area and a memory area in the lower chip in the CIS of FIG. 1 according to an example embodiment.

FIG. 4 is a schematic diagram showing a logic area and a memory area disposed on a lower chip 200 in the CIS 1000 of FIG. 1, according to an example embodiment.

Referring to FIG. 4, the lower chip 200 may include logic area 210 and memory area 220. A plurality of logic circuits are arranged in the logic area 210. As will be appreciated, the logic area 210 may be subdivided into small areas in correspondence to respective circuits.

MRAM may be disposed in the memory area 220, and the MRAM may be embedded in the lower chip 200. For example, the logic circuits of the logic area 210 and the MRAM of the memory area 220 may be disposed together in the lower chip 200 and manufactured from a CMOS manufacturing process. For example, both the MRAM of the memory area 220 and the logic circuits of the logic area 210 may be formed from transistors formed with the same semiconductor substrate cut from a semiconductor wafer (e.g., source/drain regions of transistors of the MRAM of the memory area 220 and the logic circuits of the logic area 210 may be formed in the same semiconductor crystalline substrate).

In FIG. 4, although the memory area 220 is shown as being disposed on the lower right portion of the lower chip 200, the position of the memory area 220 is not limited thereto. For example, the memory area 220 may be located at any portion of the lower chip 200 and/or may be divided into several discrete sections. In the structure in which the upper chip 100 and the lower chip 200 are stacked, since the wiring of the upper chip 100 and the wiring of the lower chip 200 need to be electrically connected to each other, the memory area 220 may be disposed at a portion that does not disturb the electric connection.

Although the memory area 220 is shown as being a rectangular area, the structure of the memory area 220 is not limited thereto. For example, the memory area 220 may have one of various structures, such as a circular structure, an elliptical structure, and polygonal structures other than rectangular structures. A plurality of MRAM cells may be arranged in a two-dimensional array structure in the memory area 220. The two-dimensional array structure of MRAM cells will be described below with reference to FIGS. 6A and 6B.

Figure 5:
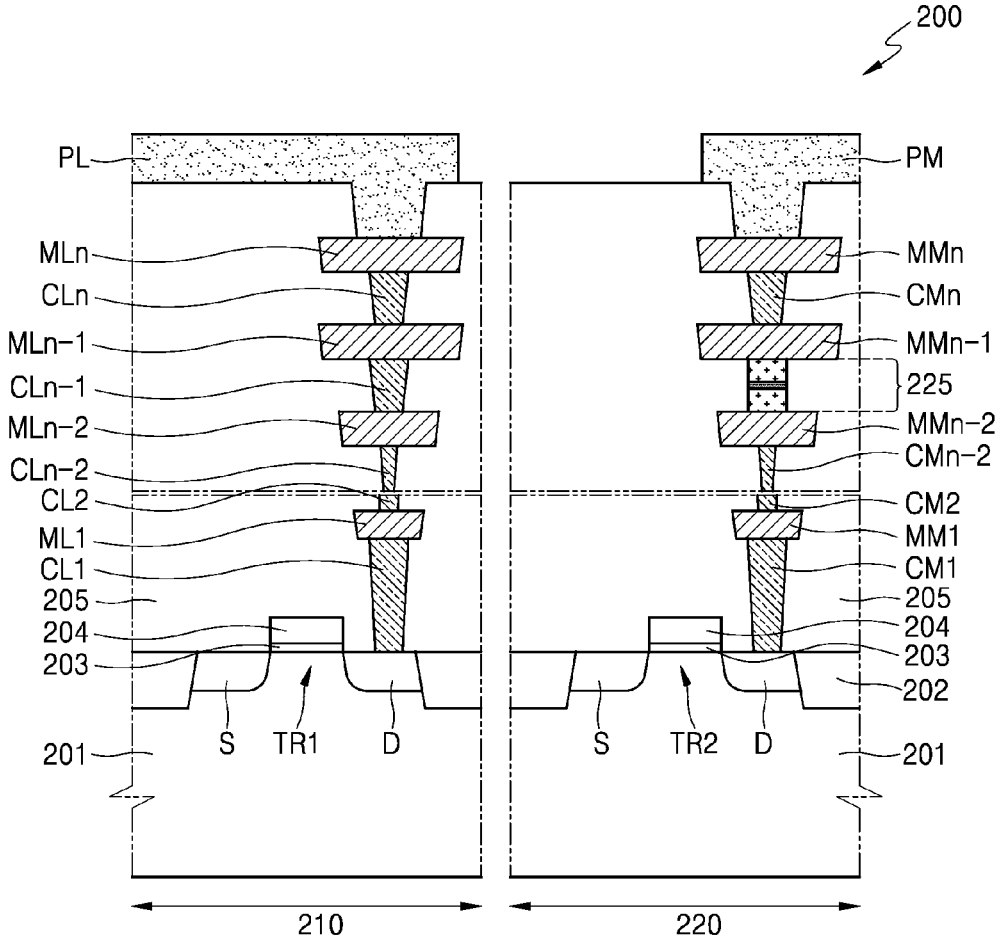
FIG. 5 is a cross-sectional diagram showing a logic area and a memory area in the lower chip of FIG. 4 according to an example embodiment.

FIG. 5 is a cross-sectional diagram showing a logic area and a memory area in the lower chip 200 of FIG. 4, according to an example embodiment. *FIG. 5 depicts one segment of the layers that form a portion of the logic area and one segment of the layers that form a portion of the memory area. Other segments that form additional transistors and MTJ structures are not shown in FIG. 5, but some additional transistors and MTJ structures and their connections to wire layers, at least for the memory area, are shown in the circuit diagram of FIG. 6A.* Logic circuits of the logic area 210, such as a first transistor TR1, and a cell transistor TR2 of the memory area 220, may be disposed together on the same semiconductor substrate 201 and formed through the same CMOS manufacturing process. Semiconductor substrate may comprise a crystalline semiconductor substrate, such as a substrate cut from a crystalline bulk wafer, a SOI (silicon on insulator) wafer, etc. Furthermore, wire layers ML1, MLn−2, MLn−1, and MLn, contacts CL1, CL2, CLn−2, CLn−1, and CLn, and an Al pad PL that are disposed above the first transistor TR1 of the logic area 210 and wire layers MM1, MMn−1, MMn−1, and MMn, contacts CM1, CM2, CMn−2, and CMn, and an Al pad PM that are disposed above the cell transistor TR2 may also be deposited and patterned together through the same CMOS processes. For example, contacts of the logic area 210 and the memory area 220 that are at the same vertical level in FIG. 5 may be simultaneously formed from the same photoresist patterning process and same subsequent etching process. Similarly, wire layers (and wiring formed by these wiring layers) of the logic area 210 and the memory area 220 that are at the same vertical level in FIG. 5 may be simultaneously formed from the same metal layer (and patterned by the same metal layer patterning process, such as the same damascene process). However, numbers and locations of wire layers and contacts of the logic area 210 may not be identical to those of the memory area 220 because the number of wire layers required by logic circuits constituting the logic area 210 may be different from the number of wire layers required by elements constituting the MRAM in the memory area 220, as well as due to various design considerations. Although an interlayer insulation film 205 is shown in FIG. 5 as a single layer on the semiconductor substrate 201, the interlayer insulation film 205 may include various numbers of layers depending on structures and numbers of wire layers and contacts.

In the CIS 1000 according to the present embodiment, the cell transistor TR2 and a MTJ structure 225 constituting a MRAM memory cell of the memory area 220 may be formed at the same time as when logic circuits and wire layers of the logic area 210 are disposed. For example, elements of the cell transistor TR2 of the MRAM memory cell may be formed together when corresponding elements of transistors constituting the logic circuits are formed in the semiconductor substrate 201. Specifically, a device isolating area 202 and source/drain areas S/D, and gate insulation films 203, and gate electrodes 204 constituting the first transistor TR1 and the cell transistor TR2 may respectively be formed at the same time on the semiconductor substrate 201. It will be appreciated that when the memory cells of the memory area 220 are other than MRAM memory cells, the same relationships between the formation and structure of these other memory cells and the formation and structure of the logic circuits may also apply as described herein with respect to the MRAM memory cell.

The MTJ structure 225 of the MRAM may also be disposed when wire layers are disposed in the logic area 210. Specifically, when two wire layers adjacent to each other and a contact therebetween are disposed in the logic area 210, the MTJ structure 225 of the MRAM may be disposed. However, since the structure and material of the MTJ structure 225 are completely different from those of a contact of the logic area 210, the MTJ structure and the logic area 210 corresponding thereto may be disposed through separate processes. For example, when the MTJ structure 225 is disposed in the memory area 220, the logic area 210 may be covered with a mask. On the contrary, when a corresponding contact is disposed in the logic area 210, the memory area 220 may be covered with a mask.

Meanwhile, although FIG. 5 shows that the MTJ structure 225 is disposed between the second wire layer MMn−2 and the third wire layer MMn−1 at the upper portion of the lower chip 200, position of the MTJ structure 225 is not limited thereto. For example, the MTJ structure 225 may be disposed anywhere between two wire layers adjacent to each other.

Figure 6A:
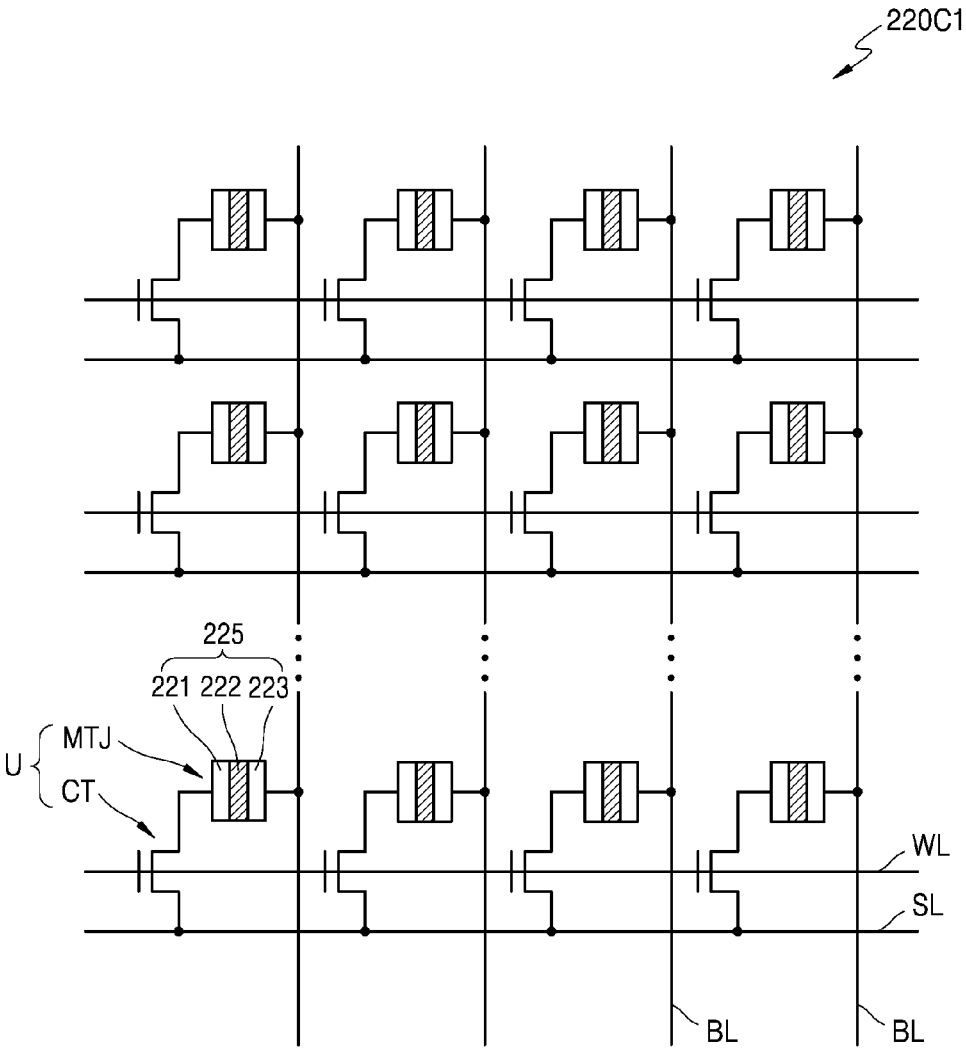
FIGS. 6A and 6B are circuit diagrams of an MRAM cell array disposed in a memory area in the lower chip of FIG. 4 according to an example embodiment.
Figure 6B:
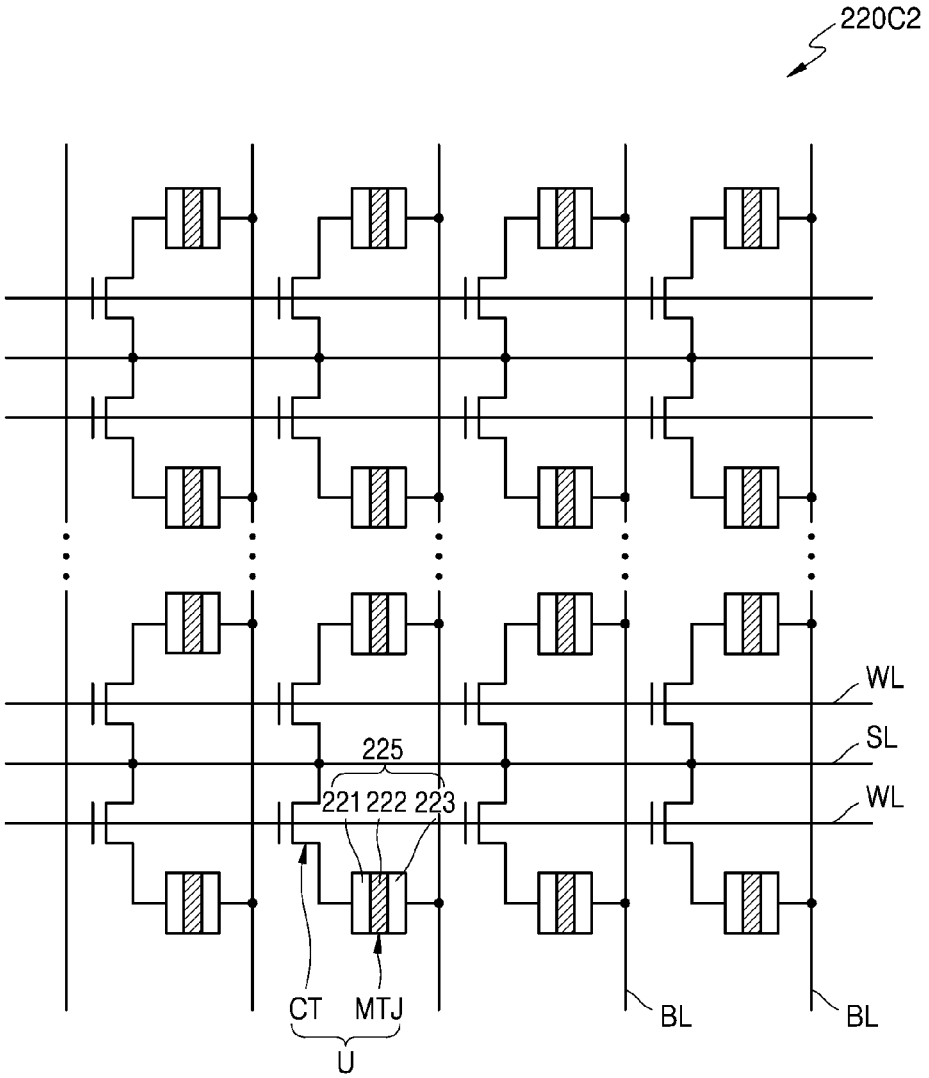

FIGS. 6A and 6B are circuit diagrams of an MRAM cell array disposed in a memory area in the lower chip 200 of FIG. 4, according to an example embodiment.

Referring to FIG. 6A, in the CIS 1000 according to the present embodiment, a MRAM cell array 220C1 having a two-dimensional array structure may be disposed in the memory area 220. The MRAM cell array 220C1 may include a plurality of word lines WL, a plurality of bit lines BL, a plurality of source lines SL, and a plurality of MRAM cells U arranged at locations where the plurality of word lines WL intersect with the plurality of bit lines BL. The one unit cell U includes a MTJ structure MTJ 225 and a cell transistor CT and may be selected by selecting one bit line BL and one source line SL. Therefore, the MRAM cell array 220C1 according to the present embodiment may have a 1MTJ-1TR structure. The MTJ structure 225 may basically include a pinned layer 221, a tunnel layer (or a barrier layer) 222, and a free layer 223. The specific structure of the MTJ structure 225 will be described below in more detail with reference to FIGS. 7A through 7D.

Regarding a connecting structure of the unit cell U, the pinned layer 221 of the MTJ structure 225 may be connected to a drain of the cell transistor CT, and the free layer 223 of the MTJ structure 225 may be connected to the bit line BL. Furthermore, a source of the cell transistor CT may be connected to the source line SL, and a gate of the cell transistor CT may be connected to the word line WL.

Alternatively, rather than MTJ structure 225, the memory cell of the memory 220 may be formed with a resistive element, such as phase change random access memory (PRAM) using a phase change material, or resistive random access memory (RRAM), using a variable resistance material like a complex metal oxide. Furthermore, the MTJ structure 225 may also be replaced with a resistive element of the memory 220 using a ferromagnetic material. Materials constituting resistive elements may have resistances varying according to a magnitude and/or a direction of a current or a voltage and may exhibit non-volatile characteristics for maintaining a resistance value even when a current or a voltage is blocked.

MRAM is a non-volatile memory device based on magneto-resistance. MRAM may have read and write response times comparable to those of volatile RAM. For example, MRAM may be an omnipotent memory device exhibiting both low-cost and high-capacity characteristics of DRAM, high-speed operation characteristics of SRAM, and non-volatile characteristics of flash memory.

MRAM may be a non-volatile memory device that reads and writes data using the MTJ structure 225 including two magnetic layers and an insulating film interposed therebetween. The resistance value of the MTJ structure may be changed according to magnetization directions of the magnetic layers, where a difference between resistance values may be used to program data (that is, to store data) or to erase data. MRAM may change a magnetization direction of a magnetic layer by using a spin transfer torque (STT) phenomenon.

In the MTJ structure 225, the magnetization direction of the pinned layer 221 may be fixed and the magnetization direction of the free layer 223 may be changed by an applied program current. In other words, the magnetization directions of the two magnetic layers 221 and 223 may be arranged parallel or anti-parallel to each other as the magnetization direction of the free layer 223 is changed by the program current. When the magnetization directions are parallel, the MTJ structure 225 may be in a low ("0") state indicating a low resistance between the two magnetic layers 221 and 223. When the magnetization directions are anti-parallel, the MTJ structure 225 may be in a high ("1") state indicating a high resistance between the two magnetic layers 221 and 223. Write and read operations of MRAM may be achieved according to switching of the magnetization direction of the free layer 223 and the high or low resistance state between the magnetic layers associated with the switching of the magnetization direction of the free layer 223.

The word line WL may be enabled by the row decoder and may be connected to a word line driver for driving a word line select voltage. The word line select voltage activates the word line WL to perform a read or write operation with respect to the MTJ structure 225. The source line SL is connected to a source line circuit. The source line circuit receives an address signal and a read/write signal, decodes the received signals, and applies a source line selection signal to the selected source line SL. A ground reference voltage is applied to the unselected source lines SL.

The bit line BL is connected to a column selecting circuit driven by a column selection signal. For example, a selected column select signal turns ON a column selecting transistor in the column select circuit and selects the bit line BL. The logic state of the MTJ structure 225 is output through a sense amplifier to the selected bit line BL through a read operation. Furthermore, a write current is transferred to the selected bit line BL through a write operation, and thus, a value corresponding to the logic state is stored in the MTJ structure 225.

Referring to FIG. 6B, a MRAM cell array 220C2 according to the present embodiment may be different from the MRAM cell array 220C1 of FIG. 6A in the connection structure of the source line SL. For example, although the MRAM cell array 220C1 of FIG. 6A may have a 1MTJ-1TR structure in which the one cell transistor CT and the MTJ structure 225 are selected by selecting the one bit line BL and the one source line SL, MRAM cell array 220C2 according to the present embodiment may have a 2MTJ-2TR structure in which the two cell transistors CT and the MTJ structure 225 are selected by selecting the one bit line BL and the one source line SL. Therefore, the source line SL of the MRAM cell array 220C2 according to the present embodiment may be commonly connected to sources of the two cell transistors CT.

Generally, the structure of the MRAM cell array 220C1 of FIG. 6A is referred to as a separate source line structure, whereas the structure of the MRAM cell array 220C2 of FIG. 6B is referred to as a common source line structure.

In order to store the logic states "0" and "1" in the MTJ structure 225, which is a memory element, it is necessary for a current flowing through the MTJ structure 225 to be bi-directional. In other words, a current flowing in the MTJ structure 225 when data "0" is being written should flow in a direction opposite to a direction in which a current flows in the MTJ structure 225 when data "1" is being written. To implement a MRAM having a structure in which currents flow in directions opposite to each other, the source line SL is provided in addition to the bit line BL to change a difference between potentials of the MTJ structure 225 and the cell transistor CT, and thus a direction in which a current flows in the MTJ structure 225 may be selected.

According to connection structures of a source line and methods of operating the same, structures of an MRAM are categorized into the separate source line structure and the common source line structure as described above. In the case of the common source line structure, since the source line SL is shared by both cell transistors, common source line structure may be efficient in terms of a space, but the operating voltage thereof may be increased, because the reference voltage is applied to the source line SL. On the other hand, in the case of the separate source line structure, since voltages of the bit line BL and the source line SL are interchangeable, the operating voltage of an MRAM may be lowered. However, since it is necessary to arrange all the source lines SL corresponding to the bit lines BL, the separate source line structure may be less efficient in terms of a space, that is, density.

FIGS. 7A to 7D are schematic diagrams showing various embodiments of a MTJ structure included in MRAM according to an embodiment.

Figure 7A:
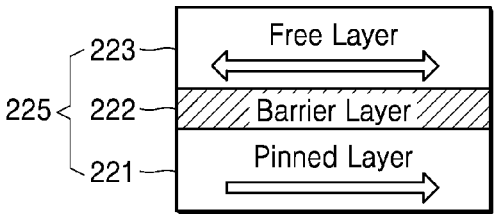
FIGS. 7A to 7D are schematic diagrams showing various example embodiments of a MTJ structure included in MRAM.

Referring to FIG. 7A, the MTJ structure 225 may include the pinned layer 221, the free layer 223, and the tunnel layer 222 therebetween. The magnetization direction of the pinned layer 221 is fixed and the magnetization direction of the free layer 223 may be parallel or anti-parallel to the magnetization direction of the pinned layer 221 according to data stored through a write operation. In order to fix the magnetization direction of the pinned layer 221, an anti-ferromagnetic layer may be further provided, for example.

The free layer 223 may include a material having the variable magnetization direction. The magnetization direction of the free layer 223 may be changed based on electric/magnetic factors provided outside and/or inside a cell. The free layer 223 may include a ferromagnetic material including at least one of cobalt (Co), iron (Fe), and nickel (Ni). For example, the free layer 223 may include at least one selected from among FeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$.

The tunnel layer 222 may have a thickness smaller than a spin diffusion length. The tunnel layer 222 may include a non-magnetic material. For example, the tunnel layer 222 may be include at least one selected from among oxides of magnesium (Mg), titanium (Ti), aluminum (Al), magnesium-zinc (MgZn), and magnesium-boron (MgB) and nitrides of titanium (Ti) and vanadium (V).

The pinned layer 221 may include a ferromagnetic material layer or a double-layer structure having a ferromagnetic material layer and an anti-ferromagnetic material layer. The anti-ferromagnetic material layer may include at least one selected from among PtMn, IrMn, MnO, MnS, MnTe, $MnF_2$, $FeCl_2$, FeO, $CoCl_2$, CoO, $NiCl_2$, NiO, and Cr.

Figure 7B:
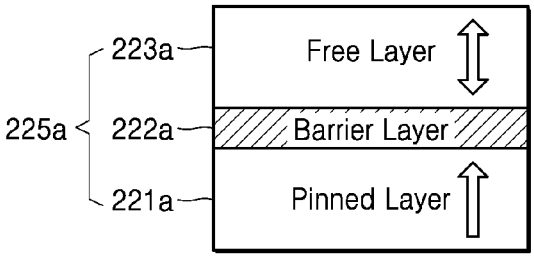

Referring to FIG. 7B, a MTJ structure 225a according to the present embodiment has a magnetization direction perpendicular to a tunnel layer 222a, and thus a direction in which a current flows and an easy axis are substantially parallel to each other. Such a structure having a vertical magnetization direction is referred to as a perpendicular MTJ structure.

The vertical MTJ structure 225a also includes a pinned layer 221a, the tunnel layer 222a, and a free layer 223a. When the magnetization directions of the free layer 223a and the magnetization direction of the pinned layer 221a are parallel to each other, the resistance of the MTJ structure 225a may decrease. On the other hand, when the magnetization direction of the free layer 223a and the magnetization direction of the pinned layer 221a are anti-parallel to each other, the resistance of the MTJ structure 225a may increase. Therefore, data may be stored in the vertical MTJ structure 225a according to resistance values.

In order to implement the vertical MTJ structure 225a, the free layer 223a and the pinned layer 221a may include a material having large magnetic anisotropic energy. Examples of materials with large magnetic anisotropic energy include amorphous rare earth element alloys, multi-layer thin films, such as (Co/Pt)n and (Fe/Pt)n, and ordered lattice materials having an L10 crystal structure. For example, the free layer 223a may include an ordered alloy and may include at least one from among iron (Fe), cobalt (Co), nickel (Ni), palladium (Pa), and platinum (Pt). Furthermore, the free layer 223a may include at least one from among a Fe—Pt alloy, a Fe—Pd alloy, a Co—Pd alloy, a Co—Pt alloy, an Fe—Ni—Pt alloy, a Co—Fe—Pt alloy, and a Co—Ni—Pt alloy. These alloys may be $Fe_{50}Pt_{50}$, $Fe_{50}Pd_{50}$, $Co_{50}Pd_{50}$, $Co_{50}Pt_{50}$, $Fe_{30}Ni_{20}Pt_{50}$, $Co_{30}Fe_{20}Pt_{50}$, or $Co_{30}Ni_{20}Pt_{50}$ in a chemical quantitative expression, for example.

The pinned layer 221a may be an ordered alloy and may include at least one from among iron (Fe), cobalt (Co), nickel (Ni), palladium (Pa), and platinum (Pt). For example, the pinned layer 221a may include at least one from among a Fe—Pt alloy, a Fe—Pd alloy, a Co—Pd alloy, a Co—Pt alloy, an Fe—Ni—Pt alloy, a Co—Fe—Pt alloy, and a C—Ni—Pt alloy. These alloys may be $Fe_{50}Pt_{50}$, $Fe_{50}Pd_{50}$, $CO_{50}Pd_{50}$, $Co_{50}Pt_{50}$, $Fe_{30}Ni_{20}Pt_{50}$, $Co_{30}Fe_{20}Pt_{50}$, or $Co_{30}Ni_{20}Pt_{50}$ in a chemical quantitative expression, for example.

Figure 7C:
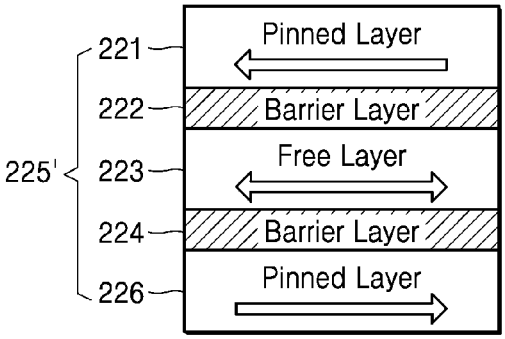

Referring to FIG. 7C, a MTJ structure 225' according to the present embodiment includes the first pinned layer 221, the first tunnel layer 222, the free layer 223, a second tunnel layer 224, and a second pinned layer 226. Such a structure in which the tunnel layers 222 and 224 and the pinned layers 221 and 226 are disposed at both ends around the free layer 223 is referred to as a dual MTJ structure. Furthermore, as shown in FIG. 7C, since a horizontal magnetism is formed based on the free layer 223, the MTJ structure 225' according to the present embodiment is referred to as a horizontal dual MTJ structure. A material of the first and second pinned layers 221 and 226 may be similar to that of the pinned layer 221 of FIG. 7A, a material of the first and second tunnel layers 222 and 224 may be similar to that of the tunnel layer 222 of FIG. 7A, and a material of the free layer 223 may be similar to that of the free layer 223 of FIG. 7A.

When the magnetization direction of the first pinned layer 221 and the magnetization direction of the second pinned layer 226 are fixed to be opposite to each other, magnetic forces due to the first and second pinned layers 221 and 226 may be substantially offset. Therefore, the dual MTJ structure 225' may perform a read operation using a smaller current as compared to a typical MTJ element. Furthermore, since the dual MTJ structure 225' has a higher resistance during a read operation due to the second tunnel layer 224, a clear data value may be obtained.

Figure 7D:
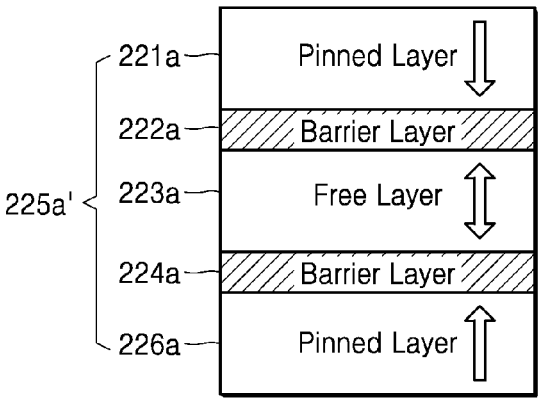

Referring to FIG. 7D, the MTJ structure 225a' according to the present embodiment includes the first pinned layer 221a, the first tunnel layer 222a, the free layer 223a, a second tunnel layer 224a, and a second pinned layer 226a. Since the MTJ structure 225a' according to the present embodiment has a dual MTJ structure and a magnetic field perpendicular to the free layer 223 is formed, the MTJ structure 225a' is referred to as a vertical dual MTJ structure. A material of the first and second pinned layers 221a and 226a may be similar to that of the pinned layer 221a of FIG. 7B, a material of the first and second tunnel layers 222a and 224a may be similar to that of the tunnel layer 222a of FIG. 7B, and a material of the free layer 223a may be similar to that of the free layer 223a of FIG. 7B.

When the magnetization direction of the first pinned layer 221a and the magnetization direction of the second pinned layer 226a are fixed to be opposite to each other, magnetic forces due to the first and second pinned layers 221a and 226a may substantially offset each other. Therefore, the dual MTJ structure 225a' may perform a read operation via a smaller current as compared to a typical MTJ element. Furthermore, since the dual MTJ structure 225a' has a higher resistance during a read operation, a clear data value may be obtained.

Figure 8A:
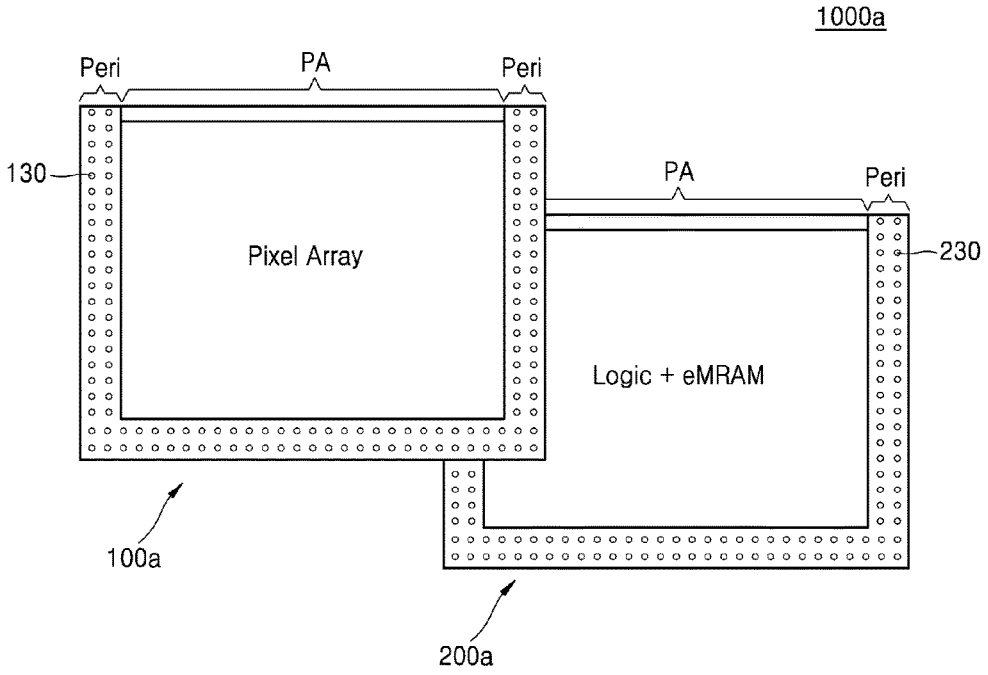
FIGS. 8A and 8B are an exploded perspective view and a cross-sectional view of a structure in which an upper chip and a lower chip are bonded to each other using a through silicon via (TSV) according to an example embodiment of the inventive concept*.
Figure 8B:
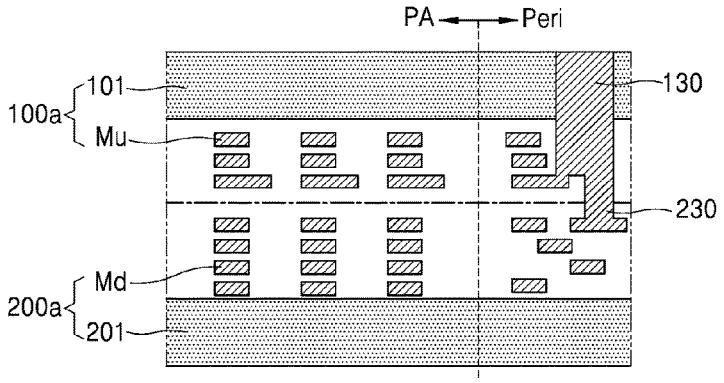

FIGS. 8A and 8B are respectively an exploded perspective view and a cross-sectional view of a structure in which an upper chip and a lower chip are connected to each other via a through substrate vias (TSVs) according to an embodiment of the inventive concept. Each of the through substrate vias (TSVs) comprise a through-hole (having a conductive wiring formed therein) extending through the substrate of a chip in which it is formed. Some or all of the TSVs may extend fully through the entire chip (through though the substrate and the insulating layers and conductive layers formed thereon constituting the integrated circuit of the chip). TSVs when implemented in a chip having a silicon substrate are referred to a through silicon vias, however the term "TSV" as used in this application should be understood to be applicable to chips having substrates other than a silicon substrate.

Referring to FIGS. [8A and 8B] *8A through 8C*, in a CIS 1000a according to the present embodiment, an upper chip 110a includes TSVs 130. Lower chip 200a may include conductors 230. The upper chip 100a and the lower chip 200a may be electrically connected to each other through electrically connecting pairs of the TSVs 130 and conductors 230 as shown in FIG. 8B.

More specifically, the upper chip 100a may include a center area PA and a peripheral area Peri outside the center area PA. In the center area PA, pixels may be arranged in a two-dimensional array structure, and the plurality of first TSVs 130 may be formed in the peripheral area Peri. As shown in FIG. 8B, a semiconductor substrate 101 may be located on the upper portion of the upper chip 100a, and pixels may be disposed on the semiconductor substrate 101. Furthermore, color filters and micro-lenses may be disposed above the semiconductor substrate 101. On the other hand, wire layers Mu may be disposed on the lower portion of the upper chip 100a.

The structure in which the color filters *132* and the micro-lenses *134* are disposed on a surface of upper chip 100a opposite to the wire layer Mu corresponding to the backside surface of the semiconductor substrate 101 *is shown in FIG. 8C*. The backside of the semiconductor substrate 101 comprises photodiodes (pixels) disposed therein. Such a structure is referred to as a back side illumination (BSI) structure. On the other hand, a structure in which the color filters and the micro-lenses are disposed on the upper chip 100a on the same side of substrate 101 (the frontside surface of substrate 101) as the wire layer Mu, that is, a structure in which color filters and micro-lenses are disposed on the wire layer Mu, is referred to as a front side illumination (FSI) structure.

In this example, the first TSV 130 is formed only in outer portions of three sides of the upper chip 100a and is not formed in the remaining one side. However, the arrangement structure of the first TSVs 130 is not limited thereto. For example, the first TSV 130 may be formed in the outer portion of at least one of four sides of the upper chip 100a. Therefore, the first TSV 130 may be formed at all four sides of the upper chip 100a. The first TSV 130 may be formed to pass through the entire upper chip 100a and the first TSV 130 may be electrically connected to the wire layer Mu disposed in the peripheral area Peri of the upper chip 110a.

The lower chip 200a may also include a center area PA and a peripheral area Peri outside the center area PA. Logic circuits and an MRAM may be arranged in the center area PA and a plurality of chip pads 230 may be arranged in the peripheral area Peri. As shown in FIG. 8B, the semiconductor substrate 201 may be disposed at the lower portion of the lower chip 200a, and a wire layer Md may be disposed at the upper portion of the lower chip 200a. Transistors of the logic circuits and cell transistors of the MRAM may be disposed on the semiconductor substrate 201.

Unlike the first TSV 130, the conductors 230 may not extend through the substrate 201 of lower chip 200a and be formed only in the upper portion of the lower chip 200a. Conductors 230 may be electrically connected to the wire layer Md disposed in the peripheral area Peri of the lower chip 200a and be electrically connected to various circuits formed within the lower chip 200a, as discussed herein. Furthermore, as the first TSV 130 and the conductors 230 are integrally connected to each other, the upper chip 100a and the lower chip 200a are electrically connected to each other through the first TSV 130 and the conductors 230.

The first TSV 130 and the conductors 230 may be formed as an inseparable integral structure. Each pair of a first TSV 130 and a conductor 230 may not be separately formed in separately manufacturing the upper chip 100a and the lower chip 200a, but may be formed as a single TSV extending fully through the upper chip 100a and fully or partially through the lower chip 200a by a TSV forming process after the upper chip 100a and the lower chip 200a have been bonded to each other. Thus, a first portion of conductor 230 may comprise a portion of TSV 130 that extends into lower chip 200a. A second portion of conductor 230 may comprise a chip pad or an internal wiring pad or wiring of lower chip 200a to which the TSV 130 extends (TSV 130 may end at such pad/wiring of conductor 230 or may extend through such pad/wiring of conductor 230).

In FIG. 8B, the dot-dashed line represents the boundary between the upper chip 100a and the lower chip 200a that are bonded to each other. Stacking and bonding of the upper chip 100a and the lower chip 200a and formation of TSVs 130 may be performed at the wafer level such that a plurality of upper chips 100a integrally formed in a first semiconductor wafer are stacked and bonded to a corresponding plurality of lower chips 200a integrally formed in a second semiconductor wafer, and a plurality of TSVs 130 are then formed in the stack of the first and second wafers. Then, each pair of the upper chip 100a and the lower chip 200a may then be separated from the stack of the first and second wafers into stacked chips. Of course, chip level stacking and bonding may alternatively be performed.

In the CIS 1000 according to the present embodiment, since the first TSV 130 fully penetrates through the upper chip 100a, when the first TSV 130 is formed in the center area PA, a space for arranging pixels may be reduced, and thus, it may become difficult to implement a CIS with high image quality.

Figure 9A:
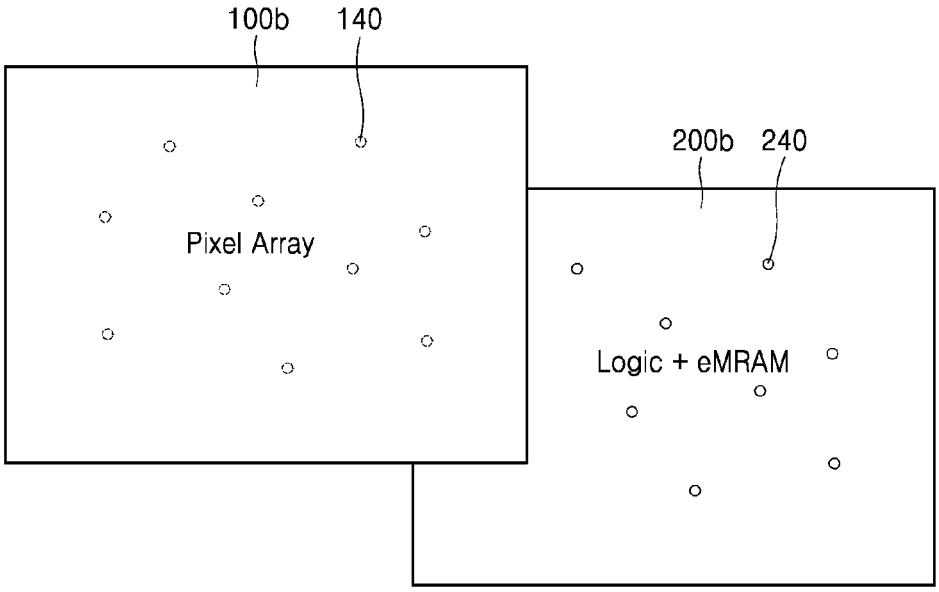
FIGS. 9A and 9B are an exploded perspective view and a cross-sectional view of a CIS according to an example embodiment of the inventive concept, the CIS having a structure in which an upper chip and a lower chip are bonded to each other via Cu—Cu direct bonding.
Figure 9B:
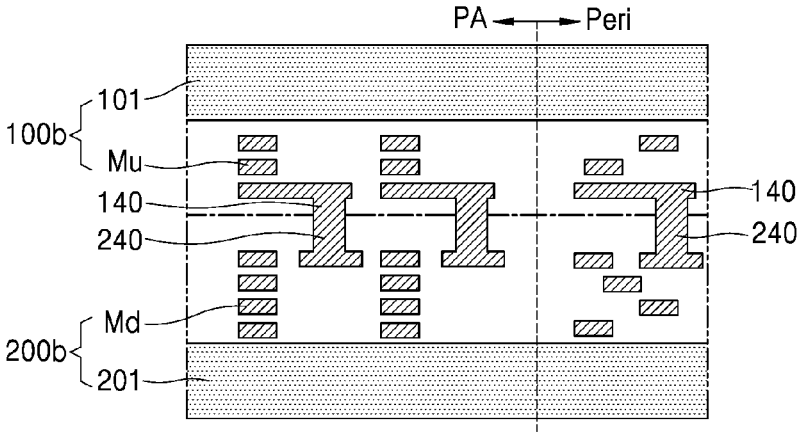

FIGS. 9A and 9B are respectively an exploded perspective view and a cross-sectional view of a CIS according to an embodiment of the inventive concept, where the CIS has a structure in which an upper chip and a lower chip are bonded to each other using Cu—Cu direct bonding.

Referring to FIGS. 9A and 9B, in a CIS 1000b according to the present embodiment, an upper chip 100b and a lower chip 200b are connected without use of TSVs. Instead, Cu (copper) pads 140 and 240 may be disposed on wire layers. It will be appreciated that pads 140 and 240 may be formed by other conductive materials.

More specifically, the upper chip 100b has a BSI structure in which the semiconductor substrate 101 is disposed at an upper portion of the upper chip 100b and pixels are disposed thereon. Unlike in FIG. 8A, pixels may be arranged in a two-dimensional array structure without distinguishing a center area from a peripheral area Peri. Therefore, the upper chip 100b may utilize the entire area as a pixel area, the upper chip 100b may implement a high image quality relatively easy. On the other hand, a first Cu pad 140 may be disposed on the wire layer Mu disposed at a lower portion of the upper chip 100b. The first Cu pad 140 may be electrically connected to the wire layer Mu and exposed from the bottom surface of the upper chip 100b.

Since the first Cu pad 140 is exposed from the bottom surface of the upper chip 100b as shown in FIG. 9B, it may not be seen from the top surface Since the first Cu pad 140 is disposed at the lower portion of the upper chip 100b and connected to internal circuitry of upper chip 100b by the wire layer Mu disposed therein, the first Cu pad 140 may not interfere with the receipt of light by photodiodes (pixels) disposed on the upper portion of the upper chip 100b. For example, the first Cu pads 140 may be disposed in the pixel area PA and overlap (having portions positioned under) with photodiode(s). Therefore, the first Cu pad 140 may be disposed anywhere in the upper chip 100b regardless of the positions of the photodiode (pixels).

A center area and a peripheral area Peri may not be distinguished from each other on the lower chip 200b, and logic circuits and MRAM may be arranged across the entire lower chip 200b. As shown in FIG. 9B, the semiconductor substrate 201 may be disposed at the lower portion of the lower chip 200b, the wire layer Md may be disposed at the upper portion of the lower chip 200b, and a second Cu pad 240 may be disposed on the wire layer Md. The second Cu pad 240 may be electrically connected to the wire layer Mu and exposed from the top surface of the lower chip 200b. Therefore, in FIG. 9A, the second Cu pad 240 is exposed from the top surface of the lower chip 200b.

The first Cu pad 140 and the second Cu pad 240 are separately formed as part of separate wafer processes of the upper chip 100b and the lower chip 200b, respectively. When the upper chip 100b and the lower chip 200b are stacked, the first Cu pad 140 and the second Cu pad 240 may be aligned and bonded to each other, and thus the first Cu pad 140 and the second Cu pad 240 may be electrically connected to each other. The process for combining a Cu pad to another Cu pad is referred to as a Cu—Cu direct bonding process. The Cu—Cu direct bonding process may be performed by aligning the upper chip 100b and the lower chip 200b to arrange the first Cu pad 140 and the second Cu pad 240 to face each other and pressing and thermally treating the same. In FIG. 9B, the dot-dashed line represents a boundary between the upper chip 100b and the lower chip 200b. The stacking and bonding of the upper chip 100b and the lower chip 200b through a Cu—Cu direct bonding process are also performed at the wafer level, and the upper chip 100b and the lower chip 200b may then be separated into stacked chips. Of course, chip level stacking and bonding is not entirely excluded.

In the CIS 1000 according to the present embodiment, even when the upper chip 100b and the lower chip 200b are electrically connected to each other through a Cu—Cu direct bonding and the upper chip 100b has the BSI structure, since the first Cu pad 140 is disposed on the wire layer Mu at the lower portion of the upper chip 100b, the Cu pads 140 and 240 may be freely disposed regardless of locations of pixels. Therefore, in the CIS 1000 according to the present embodiment, a large area for arranging pixels may be secured, and thus, thus the CIS 1000 may generate images with high image quality.

Figure 10:
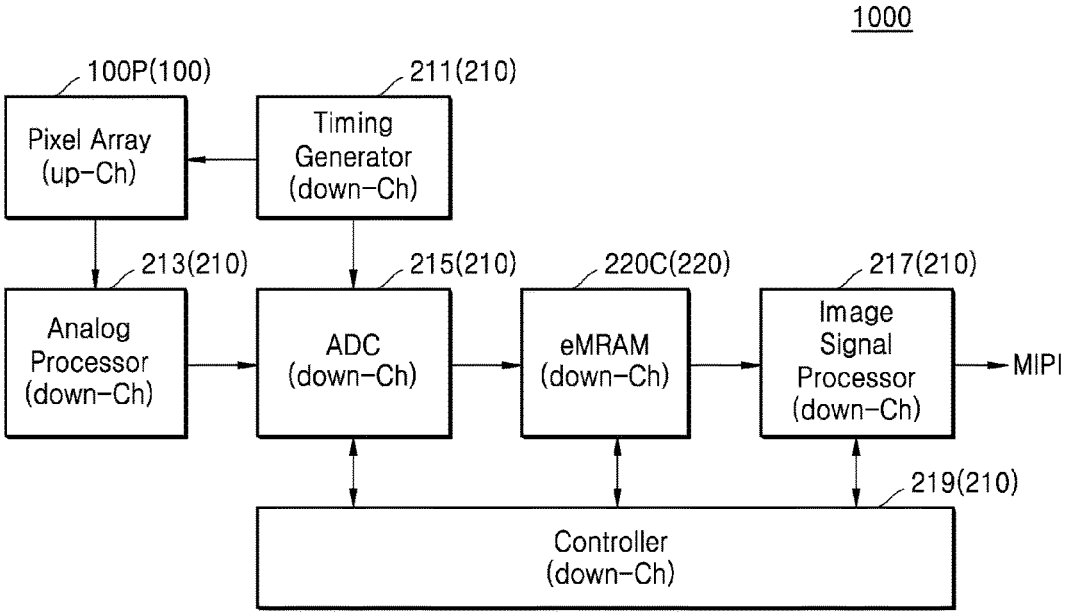
FIG. 10 is a block diagram of a CIS according to an example embodiment of the inventive concept.

FIG. 10 is a block diagram of a CIS according to an embodiment of the inventive concept.

Referring to FIG. 10, the CIS 1000 according to the present embodiment may include the pixel array 100P, a timing generating circuit 211, an analog signal processing circuit 213, an ADC circuit 215, MRAM 220C, a signal processing circuit 217, and a control circuit 219. The pixel array 100P may be disposed in the upper chip 100, whereas the remaining circuits may be disposed in the lower chip 200. The pixel array 100P may comprise the various structures described herein, such as with respect to FIGS. 2, 3A and 3B. The timing generating circuit 211, the analog signal processing circuit 213, the ADC circuit 215, the image signal processing circuit 217, and the control circuit 219 may be disposed in the logic area 210 of the lower chip 200, *such as the logic area 210 of FIG. 4,* whereas the MRAM 220C may be disposed in the memory area 220 of the lower chip 200 in an embedded form.

The timing generating circuit 211 may generate a timing signal, such as a clock pulse for controlling circuits, and supply the timing signal to circuits that operate in response to the timing signal. The analog signal processing circuit 213 may receive analog pixel signals from selected pixels of the pixel unit 100P, each analog signal representing an intensity of light a pixel received during a frame exposure period. The analog signal processing circuit 213 may process pixel signals from the pixel unit 100P of the upper chip 100, and the ADC (analog to digital converter) circuit 215 may convert each of the analog signals from the analog signal processing circuit 213 into a corresponding digital signal, the set of which forming image data such as image data of a frame corresponding to the frame exposure period. Meanwhile, the MRAM 220C may temporarily store image data from the ADC circuit 215 as frame images, the image signal processing circuit 217 may perform signal processing with respect to the image data from the MRAM 220C, and the control circuit 219 may control the overall operations of circuits. According to an embodiment, the timing generating circuit 211 may be included in the control circuit 219. Also, according to an embodiment, a signal output from the image signal processing circuit 217 may be transferred to an AP through a mobile industry processor interface (MIPI), and various image signal processing (ISP) operations may be performed at the AP.

Referring to FIG. 2, the analog signal processing circuit 213 may comprise correlated-double sampling (CDS) circuits and/or a signal amplifiers included in the row drive circuit 40 and the column signal processing circuit 50. Furthermore, the ADC circuit 215 may correspond to an AD converter included in the column signal processing circuit 50. The MRAM 220C may correspond to the image buffer memory 60, the image signal processing circuit 217 may correspond to the output circuit 70, and the control circuit 219 may correspond to the control circuit 80. For example, the analog signal processing circuit 213 may comprise a plurality of signal amplifiers in the row drive circuit 40, each of the signal amplifiers may constitute a row line driver and have an output directly connected to a corresponding row line 150 to activate a row of pixels 110 connected to the row line. Each of the signal amplifiers may be activated in sequence to output a scan pulse, the group of signal amplifiers providing scan pulses on a row-by-row basis (e.g., in a column-wise direction) during an exposure period to read out analog pixel signals from pixels 110 on a row-by-row basis. The analog signal processing circuit 213 may also comprise a plurality CDS circuits arranged in the column signal processing circuit 50, each directly connected to a corresponding column signal line 120. Upon activation of a row of pixels 110 by a signal amplifier, an analog pixel signal may be obtained by a corresponding CDS circuits connected to the pixel 110 by a corresponding column signal line 120. Column signal lines 120 and row lines 150 may be formed by wiring layers of the upper chip 100 as described herein (e.g., Mu). Row drive circuit 40 (including the signal amplifiers of the analog signal processing circuit 213) and column processing circuit 50 (including CDS circuits) may be formed in the lower chip 200 in the logic area 210.

In a CIS according to the inventive concept, MRAM may be arranged in an embedded form in a memory area of a lower chip, and the MRAM may be used as an image buffer memory for storing frame images. Therefore, the CIS according to the inventive concept may have significantly improved operation characteristics due to minimization of the rolling shutter effect by temporarily storing frame images in the MRAM and performing signal processing.

Furthermore, in the CIS according to the inventive concept, the MRAM is disposed in an embedded form together with logic circuits of a logic area, and thus, the overall manufacturing process of the CIS may be simplified and the size of an entire product may be reduced. Therefore, the CIS according to the inventive concept may be manufactured with improved yield and reduced cost.

While the inventive concept has been particularly shown and described with reference to the embodiments thereof, it will be understood that various changes in form and details may be made therein without departing from the spirit and scope of the following claims.

What is claimed is:

1. A complementary metal-oxide semiconductor (CMOS) image sensor (CIS) comprising:

an upper chip, in which a plurality of pixels are arranged in a two-dimensional array structure; and a lower chip, on which the upper chip is mounted, the lower chip comprising a logic region having arranged therein logic circuits and a memory region having embedded therein magnetic random access memory (MRAM), wherein one or more of the logic circuits are configured to generate image data in response to signals received from the upper chip and to operate the MRAM as an image buffer memory for storing the image data generated by the logic region, wherein the MRAM comprises unit cells including cell transistors and magnetic tunnel junction (MTJ) structures, the unit cells being arranged in the memory region in a two-dimensional array structure, wherein the cell transistors are arranged [on] *at a level* the same *as a* level [as] *at which* transistors of the logic region *are located*, wherein each MTJ structure comprises a pinned layer, a tunnel layer, and a free layer, wherein each MTJ structure is positioned between two wire layers adjacent to each other from among a plurality of wire layers arranged above the cell transistors, and wherein the MTJ structures are positioned between a wire layer forming a plurality of bit lines and a wire layer connected to drain regions of the cell transistors.

2. The CIS of claim 1, wherein the CIS is configured to operate according to a rolling shutter scheme for reading out data of the pixels row-by-row.

3. The CIS of claim 1, wherein the logic region comprises an analog signal processing circuit configured to process analog pixel signals received from the pixels of the upper chip, an analog-to-digital converter (ADC) circuit configured to convert an analog signal from the analog signal processing circuit into the image data, wherein the image data is a digital signal, and an image signal processing circuit configured to process the image data, and wherein the MRAM is configured to store the image data and transfer the image data to the image signal processing circuit.

4. The CIS of claim 1, wherein the MRAM is configured to store the image data as frame images.

5. The CIS of claim 1, wherein a plurality of through substrate vias (TSVs) are formed in the upper chip, and wiring of the upper chip is electrically connected to wiring of the lower chip via the TSVs.

6. The CIS of claim 1, wherein wiring of the upper chip is electrically connected to wiring of the lower chip via Cu—Cu direct bonding.

7. The CIS of claim 1, wherein, in the upper chip, color filters and micro-lenses are formed on a backside surface of a semiconductor substrate of the upper chip, wherein wire layers are arranged on a frontside surface of the semiconductor substrate, and wherein the upper chip is stacked on the lower chip such that the backside surface of the semiconductor substrate faces upward and the frontside surface of the semiconductor substrate faces toward the lower chip.

8. A complementary metal-oxide semiconductor (CMOS) image sensor (CIS) comprising:

an upper chip comprising a plurality of pixels arranged in a two-dimensional array structure and first wire layers arranged below the pixels, wherein each of the plurality of pixels comprises a photodiode and pixel transistors; and a lower chip on which the upper chip is mounted, the lower chip comprising a logic region having logic circuits formed therein, second wire layers and a memory region having [a] magnetic random access memory (MRAM) cells, wherein the first wire layers are electrically connected to the second wire layers, and wherein the MRAM is configured to operate as an image buffer memory for storing image data processed by logic circuits of the logic region, wherein the MRAM comprises unit cells including cell transistors and magnetic tunnel junction (MTJ) structures, the unit cells being arranged in the memory region in a two-dimensional array structure, wherein the cell transistors are arranged [on] *at a level* the same *as a* level [as] *at which* transistors of the logic region *are located*, wherein each MTJ structure comprises a pinned layer, a tunnel layer, and a free layer, wherein each MTJ structure is positioned between two wire layers adjacent to each other from among a plurality of wire layers arranged above the cell transistors, and wherein the MTJ structures are positioned between a wire layer forming a plurality of bit lines and a wire layer connected to drain regions of the cell transistors.

9. The CIS of claim 8, wherein through substrate vias (TSVs) are formed in at a portion of the upper chip that does not include the pixels, and wherein the first wire layers are electrically connected to the second wire layers via the TSVs.

10. The CIS of claim 8, wherein the first wire layers are electrically connected to the second wire layers via Cu—Cu direct bonding.

11. The CIS of claim 8, wherein the CIS is configured to operate according to a rolling shutter scheme for reading out data of the pixels row-by-row, wherein the logic circuits constitute an analog signal processing circuit configured to process analog pixel signals received from pixels of the upper chip, an analog-to-digital converter (ADC) circuit configured to convert an analog signal from the analog signal processing circuit into the image data, wherein the image data is a digital signal, and an image signal processing circuit configured to process the image data, and wherein the MRAM is configured to store the image data and transfer the image data to the image signal processing circuit.

12. A CMOS image sensor comprising:

a lower semiconductor chip; and an upper semiconductor chip mounted on the [upper] *lower* semiconductor chip, wherein the upper semiconductor chip comprises an array of pixels, each pixel comprising a photodiode positioned to receive light from a light source external to the CMOS image sensor and connected to a source follower transistor, the source follower transistor configured to provide an analog pixel signal corresponding to a charge accumulated by the corresponding photodiode, a plurality of column signal lines, each column signal line connected to a column of pixels to receive corresponding analog pixel signals, and a plurality of row lines, each row line connected to a corresponding row of pixels to connect each of the pixels of the row of pixels to a corresponding source follower transistor to provide the corresponding analog pixel signal to the corresponding column signal line, wherein the lower semiconductor chip comprises a logic region having arranged therein logic circuits including an analog to digital converter configured to provide digital pixel data correlated to analog pixel signals provided by the plurality of column signal lines, and a memory region, having embedded therein a magnetic random access memory (MRAM) configured to receive and store image frame data resulting from the digital pixel data provide by the analog to digital converter, wherein the MRAM comprises unit cells including cell transistors and magnetic tunnel junction (MTJ) structures, the unit cells being arranged in the memory region in a two-dimensional array structure, wherein the cell transistors are arranged [on] *at a level* the same *as a* level [as] *at which* transistors of the logic region *are located*, wherein each MTJ structure comprises a pinned layer, a tunnel layer, and a free layer, wherein each MTJ structure is positioned between two wire layers adjacent to each other from among a plurality of wire layers arranged above the cell transistors, and wherein the MTJ structures are positioned between a wire layer forming a plurality of bit lines and a wire layer connected to drain regions of the cell transistors.

13. The CMOS image sensor of claim 12, wherein the lower semiconductor chip further comprises a plurality of first circuits each directly connected to a corresponding column signal line.

14. The CMOS image sensor of claim 13, wherein each of the plurality of first circuits of the lower semiconductor chip comprise a correlated-double sampling circuit directly connected to a column signal line of the upper semiconductor chip and having an output connected to the analog to digital converter of the lower semiconductor chip.

15. The CMOS image sensor of claim 12, wherein the lower semiconductor chip further comprises a row [driver] *drive* circuit directly connected to the row lines of the upper semiconductor chip to activate selected ones of the row lines.

16. The CMOS image sensor of claim 12, wherein the lower semiconductor chip comprises a semiconductor substrate, and wherein transistors of the MRAM and transistors of the analog to digital converter each comprise source/drain regions formed within the semiconductor substrate.

*17. An image sensor comprising:*

*a first part including a plurality of pixels, each of the plurality of pixels including a photodiode; and*

*a second part configured to be electrically connected to the first part, and including a plurality of magnetic random access memory (MRAM) cells arranged in a two-dimensional array,*

*wherein the first part is stacked on the second part,*

*at least two pixels among the plurality of pixels share a plurality of transistors and a floating diffusion region, and*

*the second part comprises:*

*a substrate including a first surface that has a first region and a second region;*

*a first gate and a first source/drain disposed on the first region of the first surface of the substrate and forming a first transistor;*

*a second gate and a second source/drain disposed on the second region of the first surface of the substrate and forming a second transistor that is at a level the same as a level at which the first transistor is located;*

*a first contact disposed on the first source/drain and disposed on the first region of the first surface of the substrate;*

*a first wire layer disposed on the first contact;*

*a second contact disposed on the first wire layer;*

*a second wire layer disposed on the second contact, a width of the second wire layer being greater than a width of the first wire layer;*

*a third contact disposed on the second source/drain and disposed on the second region of the first surface of the substrate;*

*a third wire layer disposed on the third contact;*

*a magnetic tunnel junction (MTJ) structure disposed on the third wire layer, and including a pinned layer, a tunnel layer and a free layer; and*

*a fourth wire layer disposed on the MTJ structure and forming a plurality of bit lines, the third wire layer and the fourth wire layer being adjacent to each other among wire layers on the second source/drain.*

*18. The image sensor of claim 17, wherein a width of a lower portion of the first contact is less than a width of an upper portion of the first contact, and*

*a width of a lower portion of the third contact is less than a width of an upper portion of the third contact.*

*19. The image sensor of claim 17, wherein the first region of the first surface of the substrate is a logic region, and the second region of the first surface of the substrate is a memory region.*

*20. The image sensor of claim 17, wherein four pixels among the plurality of pixels share the plurality of transistors and the floating diffusion region.*

*21. The image sensor of claim 17, wherein the plurality of transistors include:*

*a reset transistor configured to reset floating charge;*

*a source follower transistor configured to provide an analog pixel signal to a column signal line; and*

*a select transistor configured to connect the analog pixel signal to the column signal line.*

*22. The image sensor of claim 17, wherein the first wire layer is on the same level as the third wire layer, and*

*the second wire layer is at the same vertical level as the fourth wire layer.*

*23. The image sensor of claim 17, wherein the second part further comprises:*

*a fifth contact disposed on the second wire layer;*

*a fifth wire layer disposed on the fifth contact;*

*a fourth contact disposed on the fourth wire layer; and*

*a sixth wire layer disposed on the fourth contact.*

*24. The image sensor of claim 17, wherein the MTJ structure is at least partially overlapped with the third contact.*

*25. The image sensor of claim 17, wherein the pinned layer includes PtMn, IrMn, MnO, MnS, MnTe, MnF2, FeCl2, FeO, CoCl2, CoO, NiCl2, NiO or Cr,*

*the tunnel layer includes magnesium (Mg), titanium (Ti), aluminum (Al), magnesium-zinc (MgZn), magnesium-boron (MgB), titanium (Ti) or vanadium (V), and*

*the free layer includes cobalt (Co), iron (Fe), nickel (Ni), FeB, Gd, Dy, CoFe, NiFe, MnAs, MnBi, MnSb, CrO2, MnOFe2O3, FeOFe2O3, NiOFe2O3, CuOFe2O3, MgOFe2O3, EuO or Y3Fe5O12.*

*26. The image sensor of claim 17, wherein the first part and the second part are connected to each other via a through substrate via (TSV).*

*27. The image sensor of claim 17, wherein the first part and the second part are bonded to each other using Cu—Cu direct bonding.*

*28. The image sensor of claim 17, wherein color filters and micro-lenses are disposed on a first surface of a substrate of the first part,*

*wire layers of the first part are arranged on a second surface of the substrate of the first part, and*

*the second surface of the substrate of the first part faces toward the second part.*

*29. The image sensor of claim 17, wherein the image sensor is configured to operate according to a rolling shutter scheme for reading out data of the plurality of pixels row-by-row.*

*30. The image sensor of claim 17, wherein the second part includes:*

*a row drive circuit configured to drive pixels among the plurality of pixels;*

*a column signal processing circuit configured to perform a signal processing with respect to signals output from the plurality of pixels;*

*an image buffer memory configured to store image data processed by the column signal processing circuit, and*

*including the plurality of magnetic random access memory (MRAM) cells arranged in the two-dimensional array;*

*an output circuit configured to output the image data transferred from the image buffer memory; and*

*a control circuit configured to control overall operations of the row drive circuit, the column signal processing circuit, the image buffer memory and the output circuit by generating one or more clock signals and/or one or more control signals.*

*31. An image sensor comprising:*

*a first chip including a plurality of pixels, each of the plurality of pixels including a photodiode; and*

*a second chip electrically connected to the first chip, and including a plurality of magnetic random access memory (MRAM) cells arranged in a two-dimensional array,*

*wherein the second chip comprises:*

*a substrate including a first surface that has a first region and a second region;*

*a first gate and a first source/drain disposed on the first region of the first surface of the substrate and forming a first transistor;*

*a second gate and a second source/drain disposed on the second region of the first surface of the substrate and forming a second transistor that is at a level the same as a level at which the first transistor is located;*

*a first contact disposed on the first source/drain and disposed on the first region of the first surface of the substrate;*

*a first wire layer disposed on the first contact;*

*a second contact disposed on the first wire layer;*

*a second wire layer disposed on the second contact;*

*a third contact disposed on the second wire layer;*

*a third wire layer disposed on the third contact, a width of the third wire layer being greater than the width of the first wire layer;*

*a fourth contact disposed on the second source/drain and disposed on the second region of the first surface of the substrate;*

*a fourth wire layer disposed on the fourth contact;*

*a fifth contact disposed on the fourth wire layer;*

*a fifth wire layer disposed on the fifth contact;*

*a magnetic tunnel junction (MTJ) structure disposed on the fifth wire layer, and including a pinned layer, a tunnel layer and a free layer; and*

*a sixth wire layer disposed on the MTJ structure and forming a plurality of bit lines, the fifth wire layer and the sixth wire layer being adjacent to each other among wire layers on the second source/drain,*

*wherein the first chip is stacked on the second chip.*

*32. The image sensor of claim 31, wherein two pixels among the plurality of pixels share a plurality of transistors and a floating diffusion region.*

*33. The image sensor of claim 31, wherein four pixels among the plurality of pixels share a plurality of transistors and a floating diffusion region.*

*34. The image sensor of claim 31, wherein a width of a lower portion of the first contact is less than a width of an upper portion of the first contact, and*

*a width of a lower portion of the fourth contact is less than a width of an upper portion of the fourth contact.*

*35. The image sensor of claim 31, wherein the first region of the first surface of the substrate is a logic region, and the second region of the first surface of the substrate is a memory region.*

*36. The image sensor of claim 31, wherein the second chip includes:*

*a row drive circuit configured to drive pixels among the plurality of pixels;*

*a column signal processing circuit configured to perform a signal processing with respect to signals output from the plurality of pixels;*

*an image buffer memory configured to store image data processed by the column signal processing circuit, and including the plurality of magnetic random access memory (MRAM) cells arranged in the two-dimensional array;*

*an output circuit configured to output the image data transferred from the image buffer memory;*

*a control circuit configured to control overall operations of the row drive circuit, the column signal processing circuit, the image buffer memory and the output circuit by generating one or more clock signals and/or one or more control signals.*

*37. An image sensor comprising:*

*a first chip including a plurality of pixels, each of the plurality of pixels including a photodiode; and*

*a second chip electrically connected to the first chip, and including a row drive circuit, a column signal processing circuit, an image buffer memory, an output circuit and a control circuit,*

*wherein the row drive circuit is configured to drive pixels among the plurality of pixels,*

*the column signal processing circuit is configured to perform a signal processing with respect to signals output from the plurality of pixels,*

*the image buffer memory is configured to store image data processed by the column signal processing circuit, and including a plurality of magnetic random access memory (MRAM) cells arranged in a two-dimensional array,*

*the output circuit is configured to output the image data transferred from the image buffer memory,*

*the control circuit is configured to control overall operations of the row drive circuit, the column signal processing circuit, the image buffer memory and the output circuit by generating one or more clock signals and/or one or more control signals, and*

*the second chip comprises:*

*a substrate including a first surface that has a first region and a second region;*

*a first gate and a first source/drain disposed on the first region of the first surface of the substrate and forming a first transistor;*

*a second gate and a second source/drain disposed on the second region of the first surface of the substrate and forming a second transistor that is at a level the same as a level at which the first transistor is located;*

*a first contact disposed on the first source/drain and disposed on the first region of the first surface of the substrate;*

*a first wire layer disposed on the first contact;*

*a second contact disposed on the first wire layer;*

*a second wire layer disposed on the second contact;*

*a third contact disposed on the second wire layer;*

*a third wire layer disposed on the third contact;*

*a fourth contact disposed on the second source/drain and disposed on the second region of the first surface of the substrate;*

*a fourth wire layer disposed on the fourth contact;*

*a fifth contact disposed on the fourth wire layer;*

*a fifth wire layer disposed on the fifth contact;*

*a magnetic tunnel junction (MTJ) structure disposed on the fifth wire layer, and including a pinned layer, a tunnel layer and a free layer, the MTJ structure directly contacting the fifth wire layer; and*

*a sixth wire layer disposed on the MTJ structure and forming a plurality of bit lines, the sixth wire layer directly contacting the MTJ structure,*

*wherein the first chip is stacked on the second chip.*

*38. The image sensor of claim 37, wherein a width of the second wire layer is greater than a width of the first wire layer,*

*a width of the third wire layer is greater than the width of the second wire layer,*

*a width of the fifth wire layer is greater than a width of the fourth wire layer, and*

*a width of the sixth wire layer is greater than the width of the fifth wire layer.*

*39. The image sensor of claim 37, wherein at least two pixels among the plurality of pixels share a plurality of transistors and a floating diffusion region.*

*40. The image sensor of claim 37, wherein four pixels among the plurality of pixels share a plurality of transistors and a floating diffusion region.*

* * * * *